(12) United States Patent
Ngoi et al.

(10) Patent No.: US 6,285,002 B1
(45) Date of Patent: Sep. 4, 2001

(54) THREE DIMENSIONAL MICRO MACHINING WITH A MODULATED ULTRA-SHORT LASER PULSE

(76) Inventors: Bryan Kok Ann Ngoi, Nanyang Technological University, School of Mechanical and Production Engineering, Nanyang Avenue, Singapore (SG), 639798; Krishnan Venkatakrishnan, Blk 101, #05-170, Jurong East St-13, Singapore (SG), 600101

( * ) Notice: Subject to any disclaimer, the term of this patent is extended or adjusted under 35 U.S.C. 154(b) by 0 days.

(21) Appl. No.: 09/307,710

(22) Filed: May 10, 1999

(51) Int. Cl.[7] .............................. B23K 26/06; B23K 26/38
(52) U.S. Cl. ................................ 219/121.73; 219/121.68
(58) Field of Search ...................... 219/121.73, 121.75, 219/121.68, 121.69, 121.86, 121.8

(56) References Cited

U.S. PATENT DOCUMENTS

| | | | |
|---|---|---|---|
| 3,724,930 | * | 4/1973 | Farmer . |
| 4,360,269 | * | 11/1982 | Iwamoto et al. . |
| 4,469,407 | * | 9/1984 | Cowan et al. . |
| 4,623,776 | * | 11/1986 | Buchroeder et al. . |
| 4,642,439 | * | 2/1987 | Miller et al. . |
| 5,034,903 | * | 7/1991 | Alfano et al. . |
| 5,034,951 | * | 7/1991 | Edelstein et al. . |
| 5,041,716 | * | 8/1991 | Wakabayashi . |
| 5,237,149 | * | 8/1993 | Macken . |
| 5,555,254 | * | 9/1996 | Injeyan et al. . |
| 5,656,186 | | 8/1997 | Mourou et al. ................. 219/121.69 |
| 5,670,069 | * | 9/1997 | Nakai et al. . |
| 5,720,894 | * | 2/1998 | Neev et al. . |
| 5,745,308 | * | 4/1998 | Spangenberg . |
| 5,761,111 | | 6/1998 | Glezer .................................. 365/106 |
| 5,768,017 | * | 6/1998 | King et al. . |
| 5,786,560 | | 7/1998 | Tatah et al. ...................... 219/121.77 |
| 5,859,424 | * | 1/1999 | Norton et al. . |
| 5,936,732 | * | 8/1999 | Smirl et al. . |
| 6,008,914 | * | 12/1999 | Sasagawa et al. . |
| 6,011,874 | * | 1/2000 | Glukstad . |
| 6,031,201 | * | 2/2000 | Amako et al. . |
| 6,034,348 | * | 3/2000 | Kim et al. . |
| 6,150,630 | * | 11/2000 | Perry et al. . |

* cited by examiner

Primary Examiner—Tom Dunn
Assistant Examiner—Kiley Stoner
(74) Attorney, Agent, or Firm—Burns, Doane, Swecker & Mathis, L.L.P.

(57) ABSTRACT

A technique and apparatus is disclosed for micro machining using an ultra short laser pulse in the range of femto second pulsing. The system is also applicable for smaller or higher pulse rates depending upon the application. The system includes methods for improving the beam quality of the laser beam by filtering. Moreover, it includes the concept of scanning the laser beam using acousto optic deflectors in the X-Y direction rather than conventional mechanical movement of the work piece or deflecting the beam using a mirror. The technique also incorporates means for modulating the ultra short laser pulse in order to control the number of pulses of the ultra short laser pulse which will strike the target surface at each of the target points by a combination of acousto optic modulators. The concept of applying elliptical or circular laser beam spots for machining rather than a circular one is also disclosed.

27 Claims, 21 Drawing Sheets

Lateral Movement of Scan Lens

Scanning the beam along a concave or convex profile.

THREE DIMENSIONAL MICRO MACHINING WITH A MODULATED ULTRA-SHORT LASER PULSE

FIELD OF THE INVENTION

The present invention relates to a method and apparatus for three-dimensional micro machining using a modulated ultra short laser pulse having different beam profiles.

BACKGROUND AND PRIOR ART

Laser beam machining is a machining method widely used for cutting, welding, etc. Although it is a convincing tool for micro machining, the continuous beam laser machining leads to a heat affected zone, and hence it is not suitable for many applications such as in the biomedical field. The continuous laser beam adversely affects the peripheral area adjacent to the focused area of the laser beam and hence cannot produce features with very high precision and control. Ultra short laser pulses find an attractive advantage over the continuous laser beam due to the reduced effect of the heat affected zone adjacent to the focused point of the laser beam. A smaller pulse rate has less influence on the periphery of the focused beam. U.S. Pat. No. 5,656,186 by Mourou et al. teaches that reducing the pulsing cycle to the range of femto seconds results in a spot size of the machined area which is smaller than the spot size of the laser beam, since the maximum intensity is at the very center of the beam waist.

An ultra short laser pulse finds wide application in transparent material such as in optical storage devices, since the damage to the adjoining area is minimized. Methods to apply ultra short laser pulses for data storage can be carried out by directly focusing the ultra short laser pulse inside the transparent material as disclosed in U.S. Pat. No. 5,761,111 by Glezer, or by splitting the laser beam and directing the separate laser beams on to a target point as in U.S. Pat. No. 5,786,560 by Tatah et al.

Although an ultra short laser pulse is an efficient tool for micro machining precise movement of the laser beam and the resolution of the beam scanning are important factors which limit the finishing and feature size. Since the beam is focused to a very small spot size and the machined surface reflects the shape of the beam profile, filtering and processing the beam are important factors that need careful consideration. Also the ultra short laser pulse needs to be modulated so that the number of pulses striking each of the target points can be controlled and a very small material removal can be achieved. Also a better finish of the machined feature can be obtained. The shape of the beam can be modified to meet a specific application such as for machining grating lines which employs an elliptical shaped beam instead of a circular shaped beam.

The present invention takes into consideration all the above mentioned factors, such as the resolution of beam scanning, modulation of the ultra short laser pulse, filtering of the laser beam and modification of the beam shape.

SUMMARY OF THE INVENTION

The first preferred embodiment of the present invention employs an ultra short laser which generates a laser pulse in the range of a femtosecond as in U.S. Pat. No. 5,656,186 by Mourou et al. for three dimensional machining applications. The disclosed invention includes a beam spatial filter to filter the ultra short laser pulse profile, which in turn improves the quality of the machining surface. The filtered beam is made to pass through a diaphragm or a slot to further enhance the beam quality.

The disclosed invention includes a laser beam modulation mechanism by using a combination of acousto optic modulators, depending on the requirements. With this ultra short laser pulse modulation, the ultra short laser pulse is prevented from striking the target during the non-machining time and vice versa.

The system of the present invention is not restricted to the modulation of a laser beam striking a surface during a machining period and non machining period, but it also controls the number of ultra short laser pulses from the source striking the target surface. By controlling the number of pulses from the ultra short laser pulse source striking the target, it is possible to machine a very small part of the material. Thus, it is possible to make features smaller than the spot size of the laser beam. That is, it is possible to ablate a hole in the target which is smaller than the spot size of the laser beam. In order to have an efficient use of laser beam energy, the system works with the operation of beam modulation acousto optic modulators for fine machining and the beam modulating acousto optic modulators switched off for rough machining.

The disclosed invention comprises a non-mechanical scanning means which employs acousto optic deflectors for scanning. Two acousto optic deflectors are used to scan the ultra short laser pulse in the X-axis and the Y-axis. The scanning beam passes through a scan lens for focusing the beam on to the target surface. The present invention includes a technique of scanning the beam along the concave or convex profile by moving the scan lens laterally. The work piece or target is positioned on a X-axis and Y-axis stage for coarse or rough movement. A Z-axis piezo electric stage is used for precision Z-axis movement, and it also is connected to an auto focusing mechanism. A camera is installed in the optical layout to monitor the machining operation of the work surface. The work piezo table is enclosed in a chamber with inlet and out for reactive gas in order to do enhanced machining operations with assisted gas. The present invention can also preferably do the process of etching or deposition reaction. The system can work also without the gas chamber.

The disclosed second embodiment of the present invention employs an elliptical beam for machining rather than circular beam as in the current known laser machining systems. The elliptical beam is obtained by using a combination of two cylindrical lens of specified appropriate focal length as required for the application. Some of the potential applications of the disclosed invention include three dimensional micro machining for in use elliptical and a spherical micro lens fabrication, optical data storage, fine grating lines, etc. The grating lines can preferably be drawn using the second embodiment of the present invention, and the length and width of the grating line can be determined by the selecting the appropriate focal length of the cylindrical lens.

The disclosed third embodiment of the present invention involves rotation of the work piece held in a chuck by a precision spindle and scanning the pulsed and modulated laser beam in a plane parallel to the axis of rotation of the workpiece. The system applies either circular or elliptical beam for the machining operation depending upon the requirement.

DETAILED DESCRIPTION OF THE INVENTION

First Embodiment of the Present Invention

Figure 1:
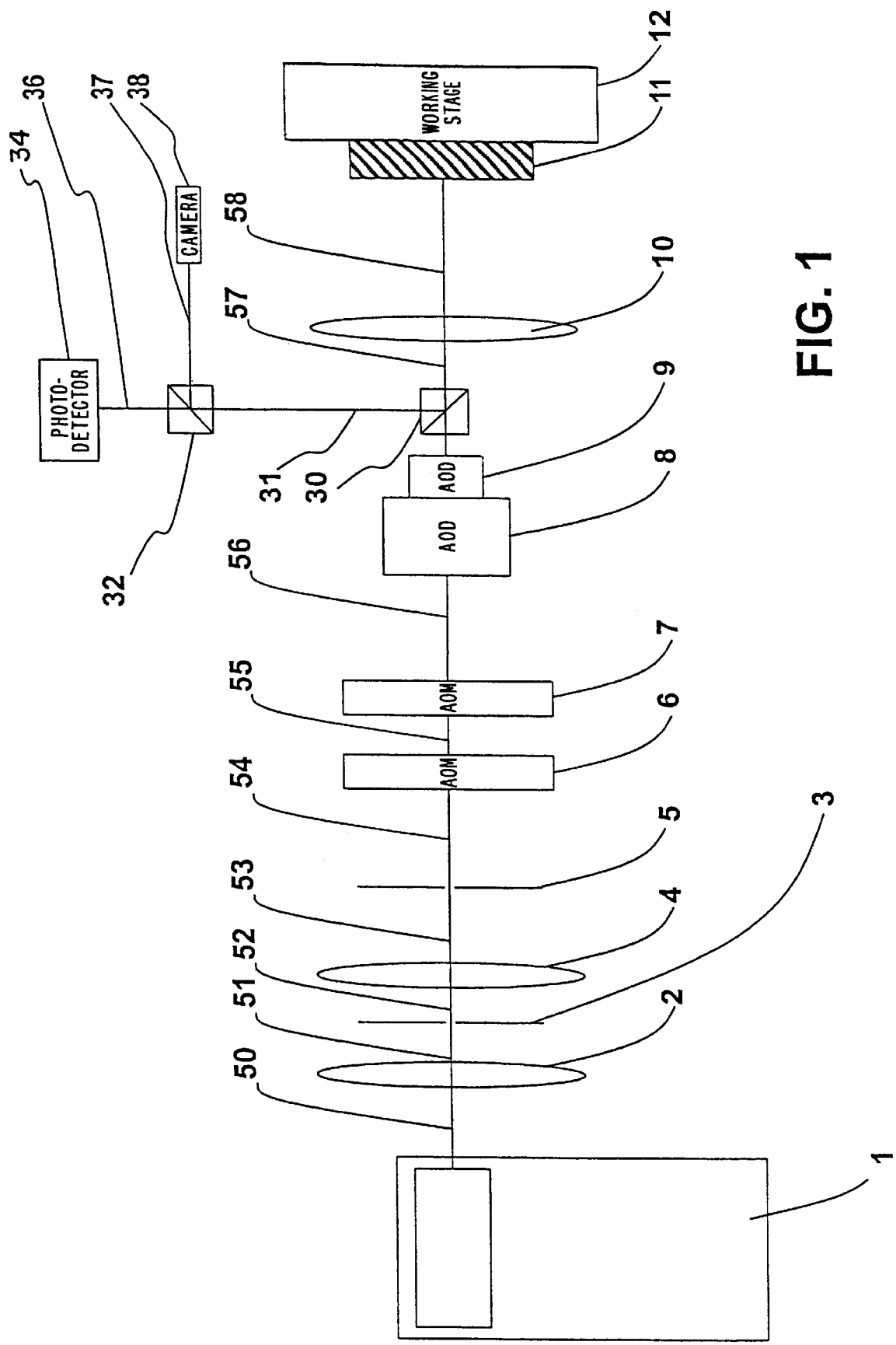
FIG. 1 is a drawing of the overall structure of the laser beam machining system according to the first embodiment of the present invention.

The preferred embodiment of the present invention depicted in FIG. 1 employs a laser source 1, which generates an ultra short laser pulse 50 preferably in the range of a femtosecond, preferably as in U.S. Pat. No. 5,656,186 by Mourou et al. The system is not restricted to a femtosecond pulse, but it can be applied for faster or slower pulse rates than the femtosecond range depending on the application requirement. The ultra short laser pulse 50 preferably passes through a beam spatial filtering mechanism, which preferably includes a focusing lens or objective lens 2, a pin hole 3 and a collimating or focusing lens 4. The details of the spatial filtering mechanism will be described in a later section. The filtered beam 53 from the lens 4 passes preferably through a circular opening or diaphragm 5, which further improves the beam quality. The filtered beam 54 preferably passes through acousto optic modulators 6 and 7, which are not limited to two acousto optic modulators, and can be varied depending on the requirement. The purpose of the acouso optic modulators 6 and 7 is preferably to modulate the number of laser pulses striking the work surface to have the desired active machining time of the laser on the machining point. The design, purpose and concept will be discussed in detail below.

The modulated ultra short laser pulse 56 from the acousto optic modulators 7 passes through acousto optic deflectors 8 and 9 in order to scan the ultra short laser pulse in the X-axis and the Y-axis. The scanning beam 57 from acousto optic deflectors 8 and 9 passes preferably through a beam splitter 30 and then through a scanning lens 10 to focus the ultra short laser pulse on to the target 11 on the working stage 12. The scanning lens can be preferably a telecentric lens, F-theta lens or confocal microscopy lens.

The performance principle of scanning lens is also described below. In order to monitor the object or the target 11, a camera 38, which is preferably equipped with a light source, is used. The light source can also be at any other convenient position. A beam splitter 30 deflects the reflected ultra short laser pulse from the target 11. The beam splitter 32 deflects the light reflected from the target 11 on to the camera 38. The deflected beam 31 passes through a beam splitter 32 to the photo detector 34. The photo detector 34 is preferably of the multiple quadrant type, and the purpose of the photo-detector 34 is to auto-focus the machining point on the target 11 at the focal point of the beam 58. The auto focusing mechanism is applied to the reflective target surface, and any suitable auto-focusing mechanism can be used for the current application.

Figure 2:
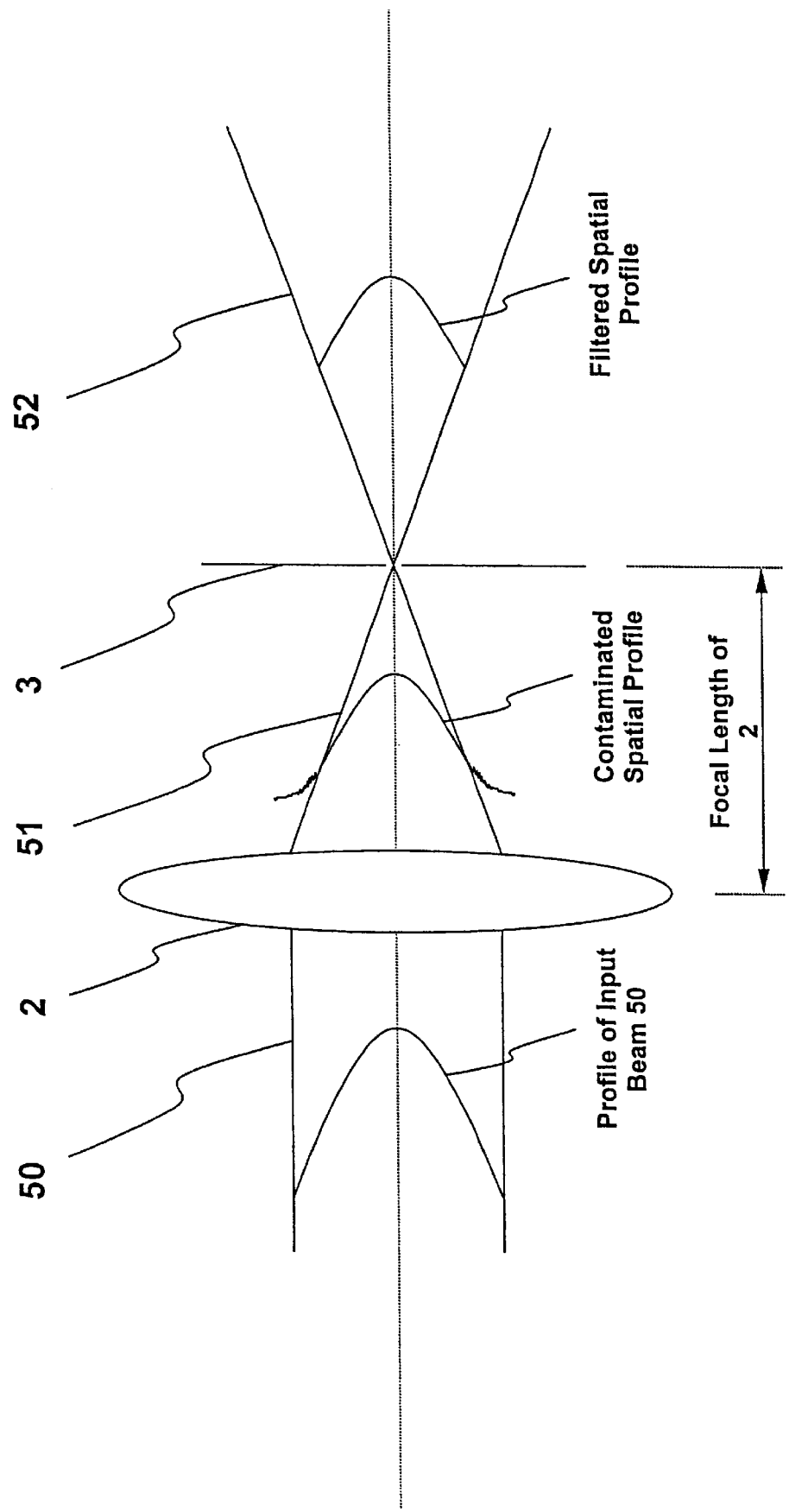
FIG. 2 is a drawing showing the elimination of the noise component in the ultra short laser pulse at the peripheral portion of the laser beam.

The embodiment of the present invention includes a beam filtering mechanism to filter the ultra short laser pulse. The spatial filtering mechanism includes preferably the collimating or focusing lens 2. The circular pin hole or slot 3 includes a hole diameter of preferably 1–1.5 times the diameter of the focal spot diameter of the laser beam focused by the lens 2, which is a diameter of the portion of the ultra short laser pulse at which the beam intensity becomes preferably $1/e^2$ of its peak intensity. This arrangement is preferably to eliminate the noise component in the ultra short laser pulse 50 at the peripheral portion of the laser beam as shown in FIG. 2. Thus, the noise generated due to the random fluctuations from the intensity profile of the ultra short laser pulse is preferably eliminated. This process of filtering may result in improving the spot size of the laser beam obtained on passing through the scanning lens 10 at the focal point of the scanning lens 10.

Figure 3:
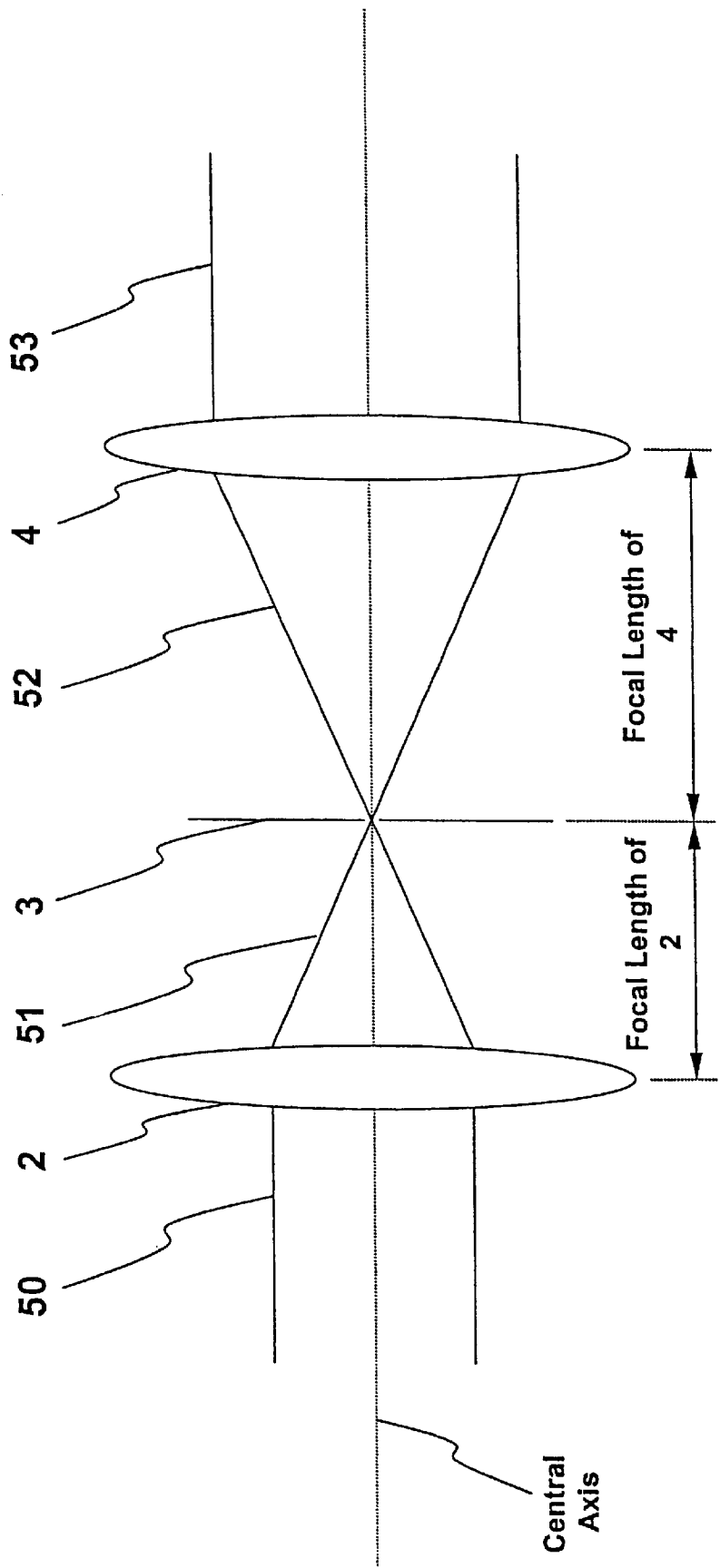
FIG. 3 is a drawing showing the positioning and alignment of the spatial filtering mechanism for the ultra short laser pulse.

Referring to FIG. 3, the pinhole or slot 3 is placed preferably at the focal point of the lens 2. A collimating or focusing lens 4 is placed preferably at a distance equal to the focal length of the lens 4 from the slot 3. This mechanism may also result in expanding the ultra short laser pulse 50. Referring to FIG. 3, in order to expand the diameter of ultra short laser pulse 53 to twice the diameter of the ultra short laser pulse 50, the focal length of the lens 4 is preferably twice that of the focal length of the lens 2. Therefore, the expansion ratio of the beam 53 to the beam 50 is equal to the ratio of focal length of the lens 4 to the lens 2. In general, expansion ratio "α" of the ultra short laser pulse is given by $$\alpha = \frac{a}{b}$$

where "b" is the focal length of the lens 4 and "a" is the focal length of the lens 2.

A portion of the total intensity of the ultra short laser pulse may be lost by filtering mechanism. The filtered and expanded beam 53 may preferably pass through the slot or diaphragm 5 which has a hole diameter of preferably 1–1.5 times the diameter of the ultra short laser pulse 53 at which its intensity is preferably $1/e^2$ of its peak intensity. This may further enhance the beam quality by eliminating the peripheral portion of the laser beam.

Figure 4:
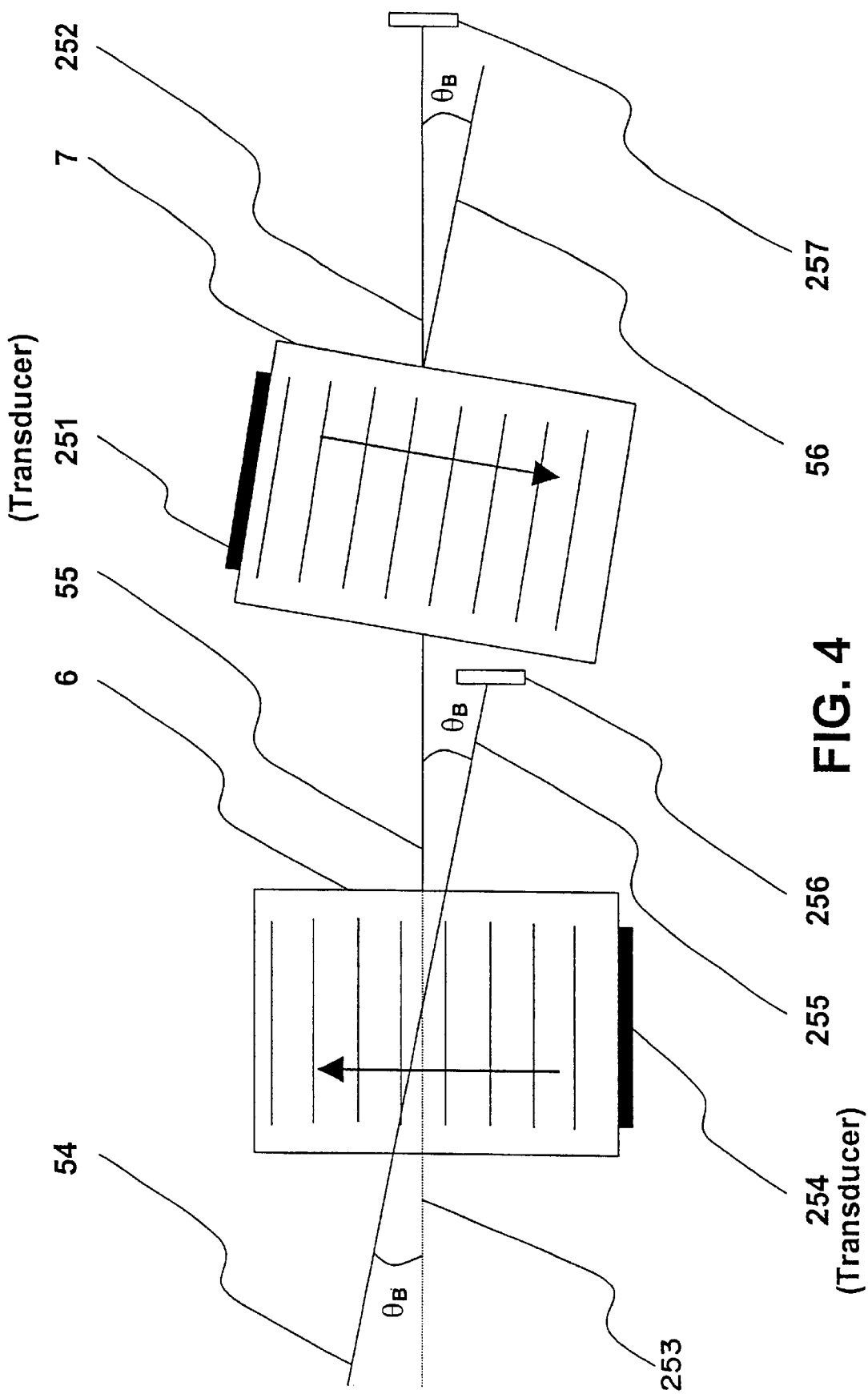
FIG. 4 is a drawing showing the positioning and the alignment of the of the two acousto optic modulators for modulating the ultra short laser pulse.

Referring to FIG. 4, the acousto optic modulator 6 is preferably positioned such that the pulsed filtered laser beam 54 incident on the acousto optic crystal in the acousto optic modulator 6 is at the Braggs angle $\theta_B$ of the crystal. Also the acousto optic modulator is preferably positioned such that the acoustic wave travels in the direction shown in FIG. 11. The beam 54 on passing through the acousto optic modulator 6 provides preferably a zero order beam 255 and a first order beam 55, which are also preferably at the Bragg angle $\theta_B$ to each other. The zero order beam 255 is preferably blocked by a beam blocking means 256. The first order beam 55 incident on the acoustic crystal of the acousto optic modulator 7 at preferably the Bragg angle $\theta_B$ of the crystal. The acousto optic modulator 7 is positioned such that the acoustic wave in its acoustic crystal is traveling in a direction opposite to that of in acousto optic modulator 6 as shown in FIG. 4. The first order beam 55 entering the acousto optic modulator 7 will result in preferably a zero order beam 252 and a first order beam 56, which are preferably at the Bragg's angle $\theta_B$ to each other. The zero order beam 252 is preferably blocked by a beam blocking means 257. This technique may preferably result in a first order beam machining beam 56 which is very close and parallel to the axis of the beam 54.

The modulation of the laser pulse is preferably to prevent the laser beam from striking the target during the inactive machining period and vice versa. But the system is not restricted to modulation of the laser beam to strike the laser surface during the machining period and non-machining period, but it also preferably controls the number of pulses of the ultra short laser pulse from the source 1 striking the target surface. For example, if the laser source 1 is emitting laser beam pulsed at 100 femto second, and the pulse repletion rate is 100 KHz, the number of pulses striking the target is $10^5$ pulse per second. The time of scanning from one machining point to another is one hundred micro second and ten pulses strike the target surface. Since each pulse carries a certain amount of energy, the total energy of the ten pulses striking the target will machine the target during the scanning from one point to the following. During the scanning from one point to the other (when machining may not be required) the beam quality is less good, so it may result in rough machining. Also when the beam is at a particular scan point for a certain time period say one micro second, the energy impinging on the target may preferably be equal to the energy of $10^7$ pulses which may be high for a particular machining surface, and hence, result in a rough machining. The size of the machined surface may also be quiet high. By controlling the number of pulses from the pulsed laser source 1 striking the target, it may be possible to damage material in a very small amount, making it possible to make features smaller than the spot size of the laser beam. Indeed, the ablated hole in the target is smaller than the spot size of the laser beam. This is preferably due to the fact that the maximum intensity is at very center of the beam waist as described in U.S. Pat. No. 5,656,186. A very small ablated hole on the target can be obtained not only by shortening the pulse width of the laser beam (i.e., from nanosecond pulsing to femto second pulsing or higher) but, by also preferably controlling the number of pulses striking the target at one machining point. With the combination of a shorter pulse width laser beam from the laser source 1 and a shorter time for which the pulsed laser strikes each of the scan point, a very small-ablated hole can be formed (smaller than the ultra short laser pulse spot size), which may not be possible otherwise. Moreover, by controlling the number of pulses striking the target surface, a very smooth surface profile can be obtained, thereby improving the surface roughness quality.

Figure 5:
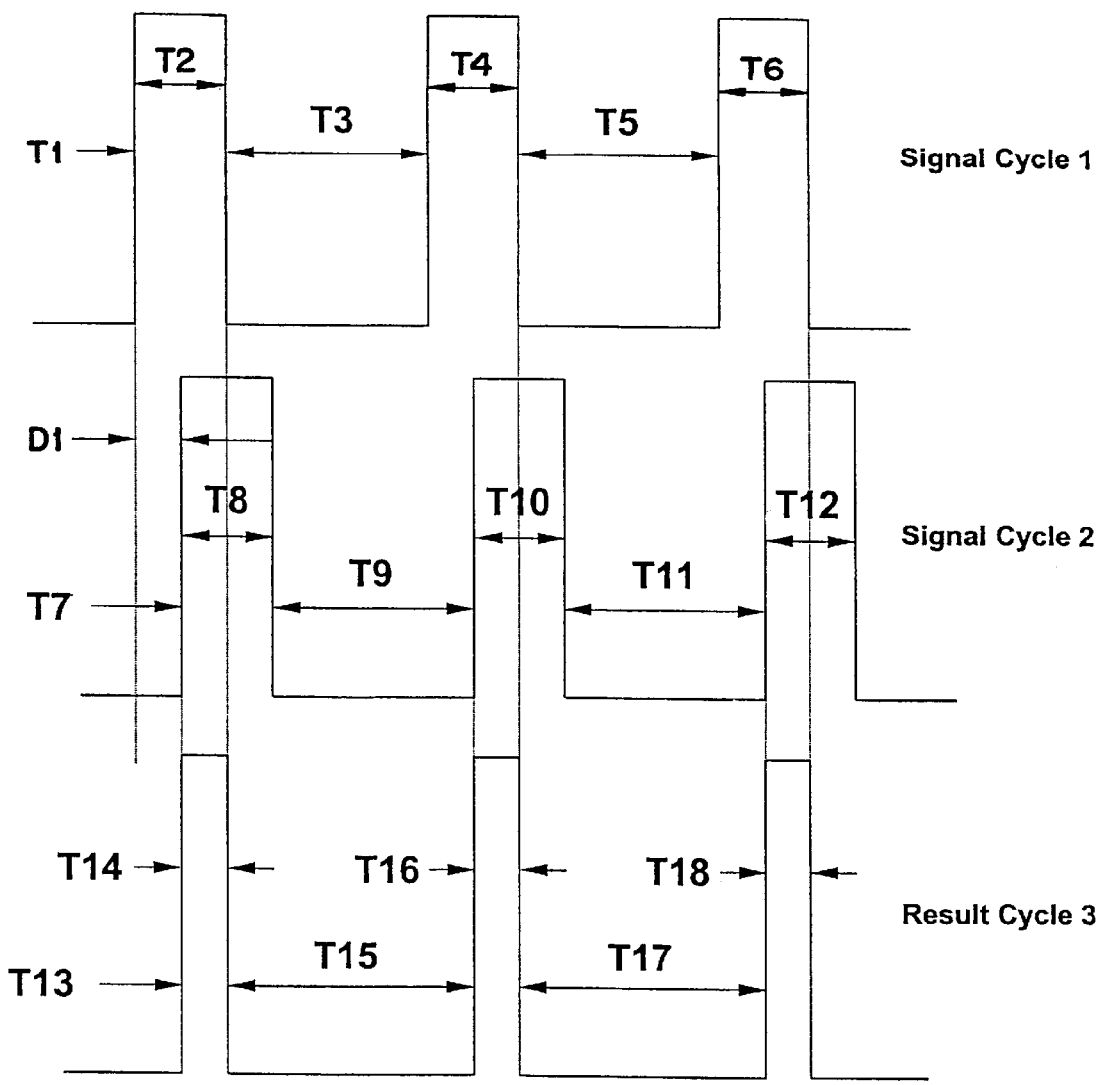
FIG. 5 is a drawing showing the pulsing cycle due to the acousto optic modulators and the resultant pulsing cycle, which is the cycle showing the actual machining and non-machining time.

The modulation of the pulsed laser by the acousto optic modulator 6 and 7 is as shown in FIG. 5. Time periods T2, T4, T6, etc. represent the time periods during which the ultra short laser pulse passes through the acousto optic modulator 6, and time periods T1, T3, T5, etc. represent the time periods during which the ultra short laser pulse is blocked by the acousto optic modulator 6. The shortest time periods T2, T4, T6, etc. may be obtained using an acousto optic modulator 6 depends on the rise time of the acousic crystal in the acousto optic modulator 6. Similarly, time periods T8, T10, T12, etc. represent the time periods during which the ultra short laser pulse passes through the acousto optic modulator 7, and time periods T7, T9, T11, etc. represent the time periods during which the ultra short laser pulse is blocked by the acousto optic modulator 7. The shortest time periods T8, T10, T12, etc. can be obtained using an acousto optic modulator 7 depends on the rise time of the acousic crystal in the acousto optic modulator 7. The time periods T14, T16, T18, etc. represent the resultant time periods during which the laser beam passes through both the acousto optic modulators 6 and 7. This is achieved by delaying the pulsing time of the acousto optic modulator 7 with respect to the acousto optic modulator 6 by D1. Time periods T14, T16, T18 can be made shorter or longer by varying the delay time D1 between the acousto optic modulators 6 and 7, and also by varying the time periods T2, T4, T6 and T8, T10, T12 depending on the requirement. The purpose of using two acousto optic modulators is to obtain a smaller time period for T14, T16, and T18, which will result in a smaller machined spot size and also better quality. The time periods T13, T15, T17 refer to the time periods during which the laser beam is scanned from one machining point to the next machining point, and no machining activity is carried out. Time periods T14, T16, T18 represent the active time periods during which machining is carried out. To obtain a very small time period for machining at each of the scan points additional acousto optic modulators can be used. As the number of acousto optic modulators increases, the intensity or energy of the pulsed machining laser beam emitted from the final acousto optic modulator will be reduced accordingly. The machining and non-machining time can be varied depending on the particular requirement.

Figure 6:
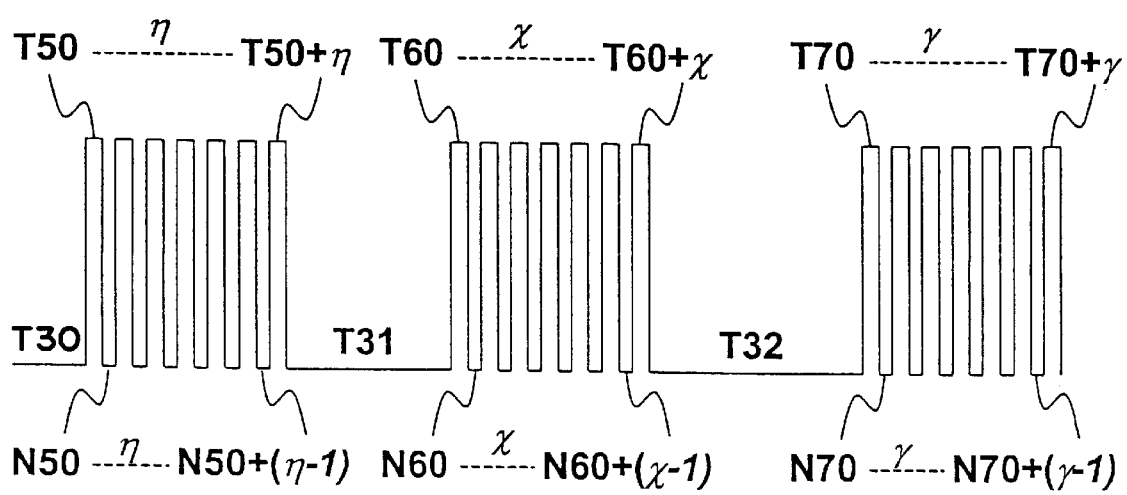
FIG. 6 is a drawing showing the cycle for machining and non-machining time at different machining locations, which can be same or different.

The non-machining time, the time required to move the laser beam from one machining location to the next machining location can be adjusted. For example, the scanning beam requires a random movement from one machining point to another, which requires a longer time period than periodic scanning movement of the ultra short laser pulse. Similarly, the machining time may vary from one set of machining points to the second set of machining points depending on the requirement. For example, referring to FIG. 6, T30, T31, T32 N50 . . . N50+($\eta$–1), N60 . . . N60+($\chi$–1),N70 . . . N70+($\gamma$–1) represents the non-machining time and T50 . . . T50+($\eta$–1),T50 . . . T50+($\eta$–1),T50 . . . T50+($\eta$–1) represent the machining time of the ultra short laser pulse. The non-machining time T30, T31, T32 may be longer due to random movement of the laser beam from one machining point to the next machining point. T50 . . . T50+($\eta$–1),T50 . . . T50+($\eta$–1),T50 . . . T50+($\eta$–1) represent a set of machining cycles at different machining locations, which can be adjusted to fit the requirements.

Figure 7:
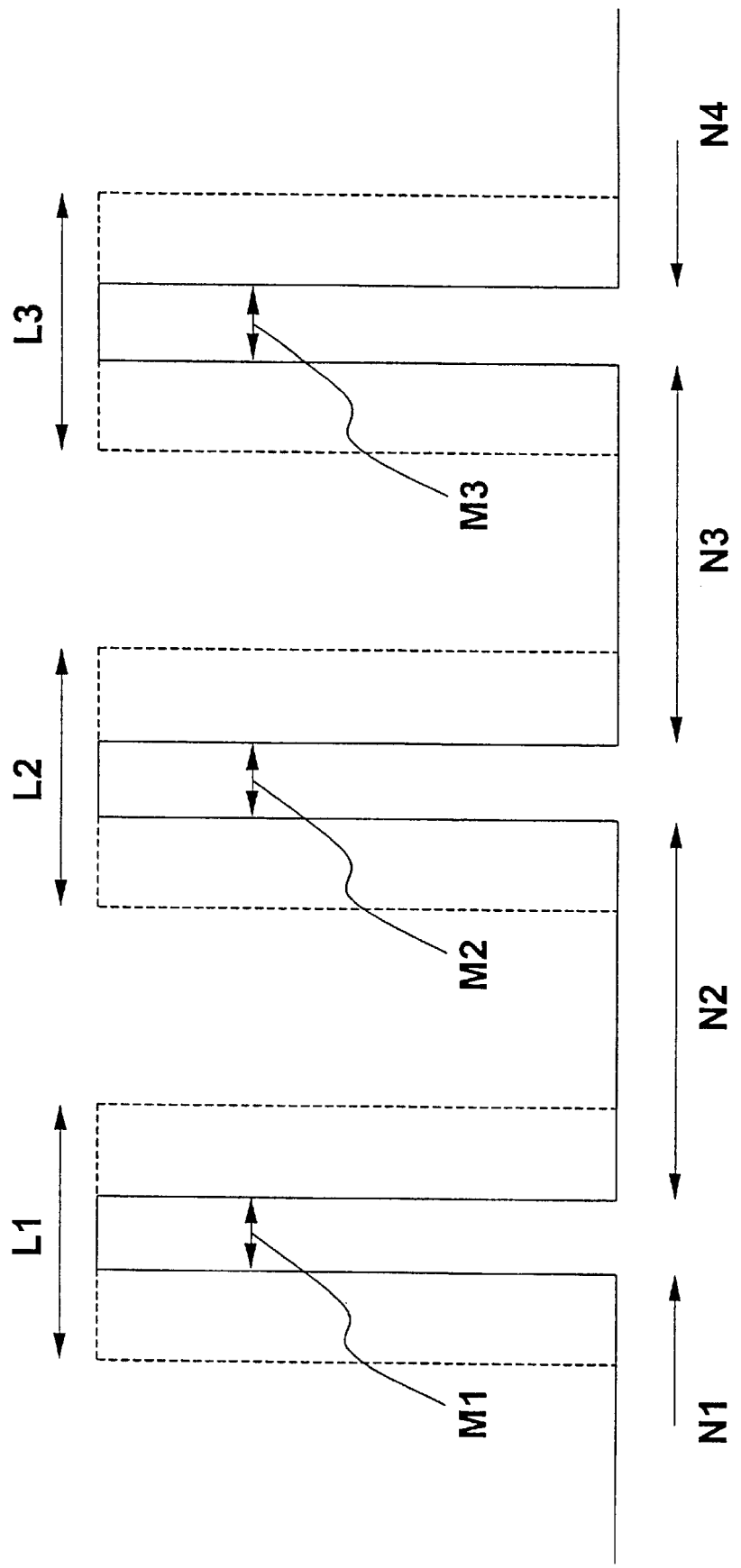
FIG. 7 is a drawing showing the time period for scanning the beam from one scan point to the next, the time period during which the beam is positioned at one scan point and the time period during which the actual machining is carried out.

The employment of the acousto optic modulator is not only to modulate the ultra short laser pulse during the movement of the scanning beam from one scan point to the next, but preferably it also controls the number of pulses striking the target at each scan point. Referring to FIG. 7, N1, N2, N3, etc. are the times taken by the scanning mechanism to move from one scan point to the next. L1, L2, L3 are the times during which the laser beam is positioned at each of the scan points without any movement. M1, M2, M3, are the time periods during which the actual machining is carried out, i.e., the time periods during which the ultra short laser pulse strikes the target. This time period of machining can be varied depending on the configuration associated with the acousto optic modulators 6 and 7.

Figure 8:
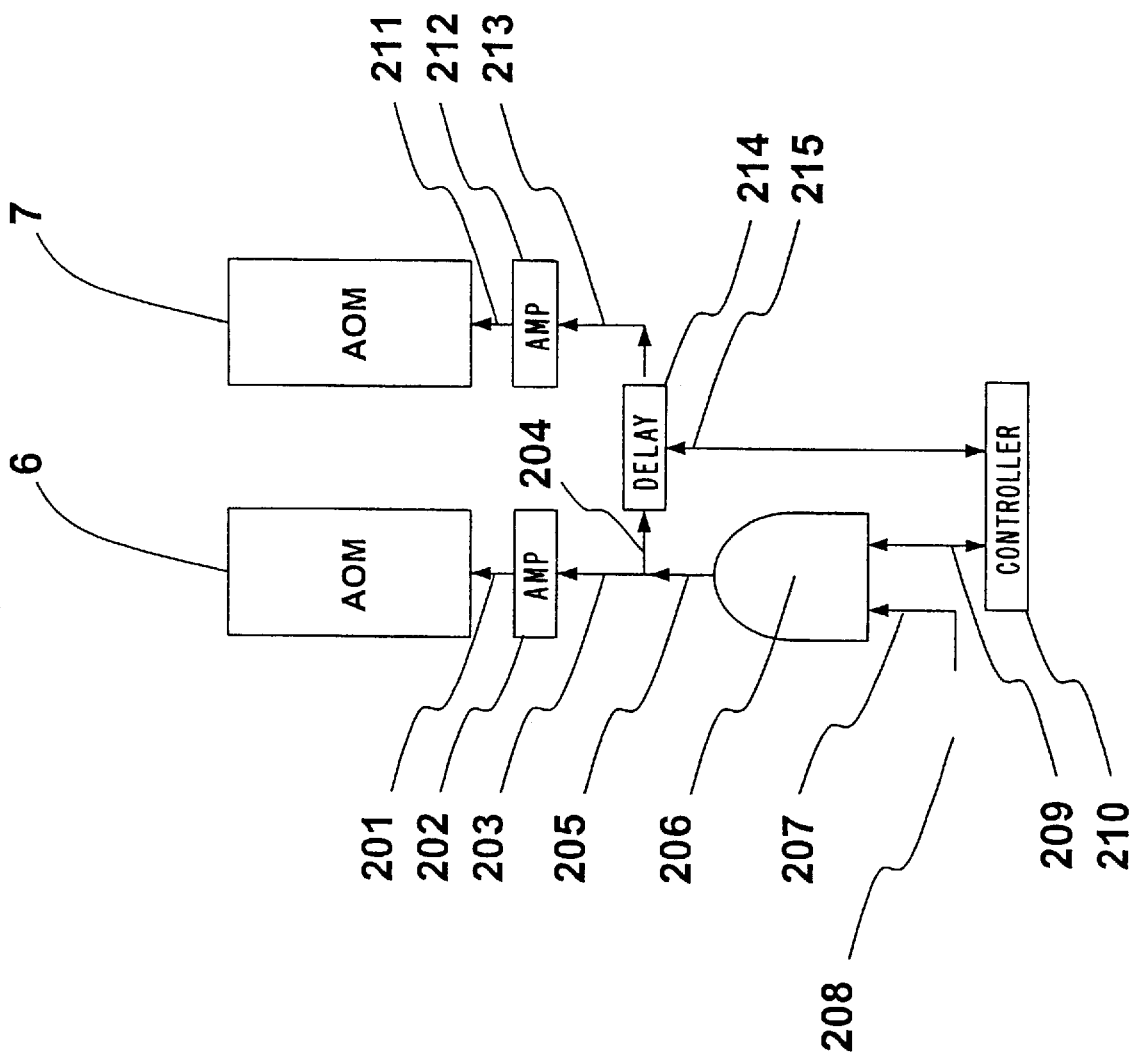
FIG. 8 is a drawing showing the control mechanism of the acousto optic modulator for the modulation of the ultra short laser pulse.

The control system for the acousto optic modulator to modulate the machining and non-machining cycle is shown in FIG. 8. The frequency signal 207 preferably is provided from a signal generator 208, and it is supplied to the AND gate 206 which receives another signal 209 preferably from the controller 210. The output signal 205 from the AND grate 206 is divided into two signals 203 and 204 by any suitable signal dividing means. The two signals 203 and 204 have the same features. The signal 203 is amplified preferably by an amplifier 202, and it is sent to the acousto optic modulator 6. The signal 204 is preferably delayed with respect to the signal 203 by a signal delay mechanism 214, which is preferably controlled by a controller 210. An amplifier 212 preferably amplifies the output delay signal 213. The amplified signal 211 is sent to the acousto optic modulator 7. The signal 207 is a preferably continuous sinusoidal frequency signal according to the specification of the acousto optic modulator from the signal generator. The controller 210 preferably provides a pulse signal to the AND gate 206. The resultant signal 205 preferably corresponds to the first signal cycle 1 of FIG. 5, and it is amplified preferably by a amplifier 202 and input to the acousto optic modulator 6. The signal 204 after passing through a delay mechanism 214 is preferably corresponds to the second signal cycle 2 of FIG. 5. The signal is then amplified by a amplifier 212 and input to the acousto optic modulator 7. The third resultant signal cycle 3 is as shown in FIG. 5 is the actual machining cycle obtained by the beam passing through both the acoustic optic modulators 6 and 7.

The concept of regulating the ultra short laser pulse is preferably to obtain a fine polished surface on the target and also make it possible to machine features smaller than the spot size. For example, referring to FIG. 9, a rough machining may be obtained when the acousto optic modulators 6 and 7 do not modulate the ultra short laser pulse. Thus, the beam passes through the two acousto optic modulators without modulation since signal are not provided to the acousto optic modulators 6 and 7. This may result in efficient machining, since the laser power is not lost by diffraction in the acousto optic modulators 6 and 7. Although the laser power is utilized effectively and thus machining speed is high, a smooth profile may not be generated, since a large amount of energy is impinging on each of the scan points.

Figure 9:
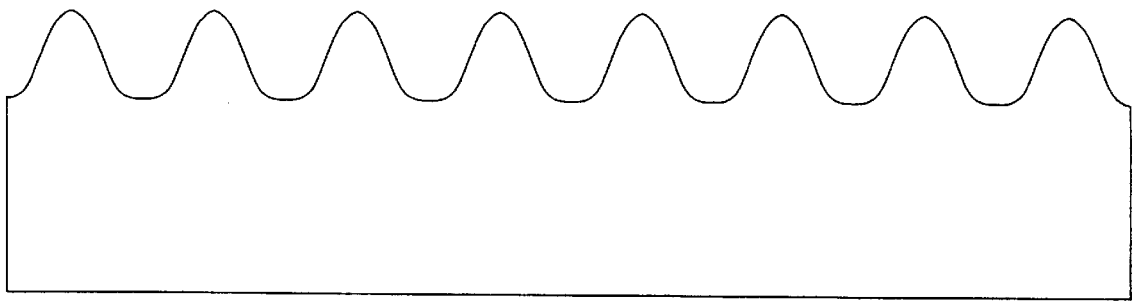
FIG. 9 is a drawing showing the surface finish obtained by not modulating the ultra short laser pulse for rough machining operation.
Figure 9A:
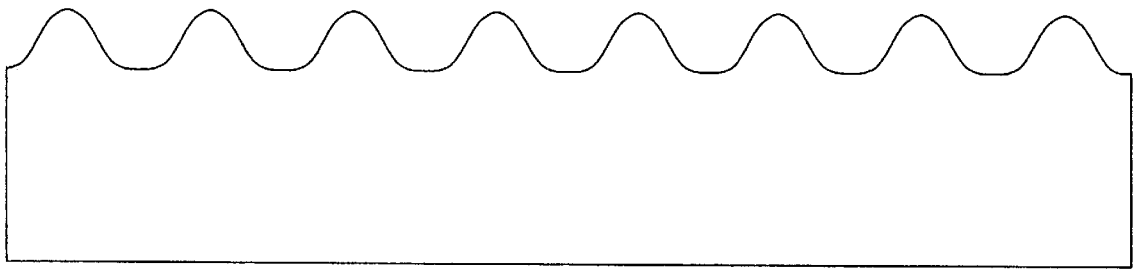
FIG. 9A is a drawing showing the surface finish obtained by modulating the ultra short laser pulse so that the machining time at each scan point is reduced for fine machining operation.
Figure 9B:
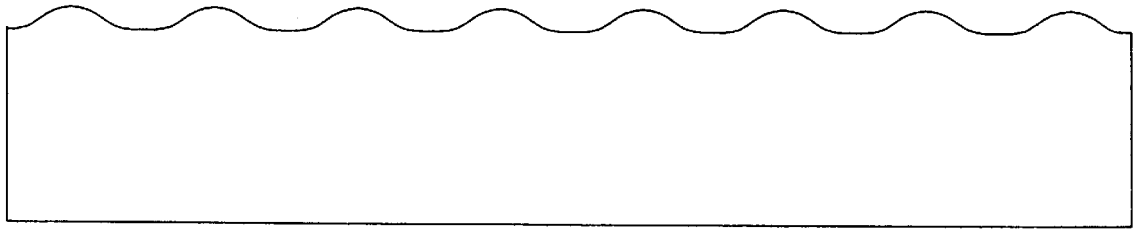
FIG. 9B is a drawing showing the surface finish obtained by modulating the ultra short laser pulse so that the machining time is further reduced at each scan point for fine machining operation.
Figure 9C:
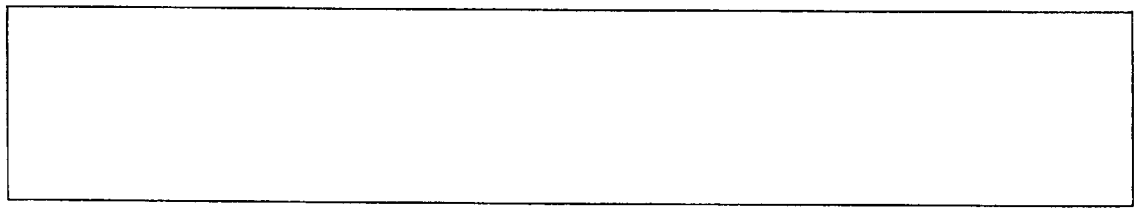
FIG. 9C is a drawing showing a polished surface.

In order to improve the surface roughness of the rough machined surface of FIG. 9, the acousto optic modulators 6 and 7 are provided with a signal in order to modulate the ultra short laser pulse. Thus, the machining time and the number of pulses of the ultra short laser pulse which strike the target is controlled. The machined surface, as shown in FIG. 9A, may be obtained. In order to improve the surface finish as shown in FIG. 9B, the number of pulses of the ultra short laser pulse striking the target at each scan point should preferably be reduced. In order to do so, the machining time needs to be reduced at each of the scan points as described above. To obtain a further polished surface as shown in FIG. 9C, a further reduction of the number of pulses of the ultra short laser pulse striking the target surface at each scan point is preferably required. There will be, however, a limit beyond which the time period for machining cannot be reduced further by using two acousto optic modulators, in which case the number of acousto modulators may be increased accordingly. The surface finish may also be improved to some extent by varying the intensity of the ultra short laser pulse. The system described in the preferred embodiment can also work without the introduction of an acousto optic modulator to modulate the laser beam. The non- machining time period is determined by the speed at which the ultra short laser pulse can be moved from one machining point to its succeeding machining location.

Figure 10:
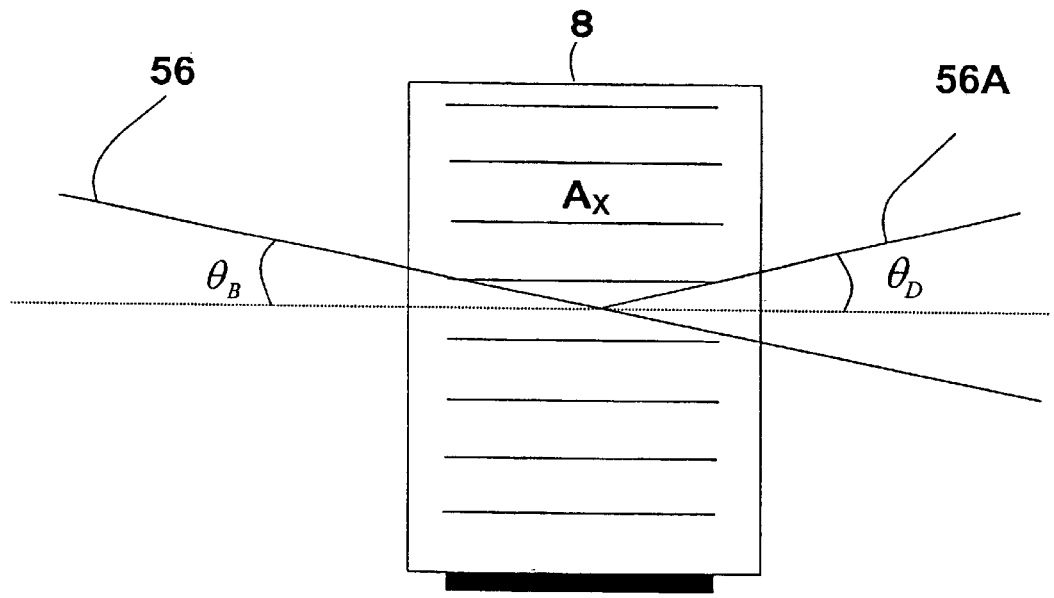
FIG. 10 is a drawing showing the alignment of the acousto optic deflector to the input ultra short laser pulse and also showing the scanning mechanism.

The scanning mechanism of the ultra short laser pulse using the acousto optic deflectors 8 and 9 as shown in FIG. 10. When the ultra short laser pulse 56 passes through the acoustic crystal of the acousto optic deflector 8 at Bragg's angle, it gives rise to first order beam 56A at a deflection angle $\theta_D$. The deflection angle of the first order beam 56A varies with the frequency input to the acousto optic deflector. At a different frequency input to the acousto optic deflector, first order beam 56A is defected at different deflection angles. Thus by varying the signal frequency input to the acousto optic deflector 8, the first order beam 56A can be made to scan from one point to the required point. Therefore, for each frequency input to the acousto optic deflector there is preferably a particular deflection angle corresponding to the frequency. Acousto optic deflector permits a scanning resolution (the distance between one point and the next succeeding scanning point) in the range of a nano meter or a sub nano-meter. The acousto optic deflector 9 works the same as the acousto optic deflector 8, except that the acousto optic deflector 8 is employed for scanning or deflecting the beam in the X-axis direction and the acousto optic deflector 9 is employed for scanning or deflecting the beam in the Y-axis direction or vice versa. With this technique, scanning of the ultra short laser pulse on both X-axis and Y-axis with nano meter or sub nano-meter resolution may be obtained.

Figure 11:
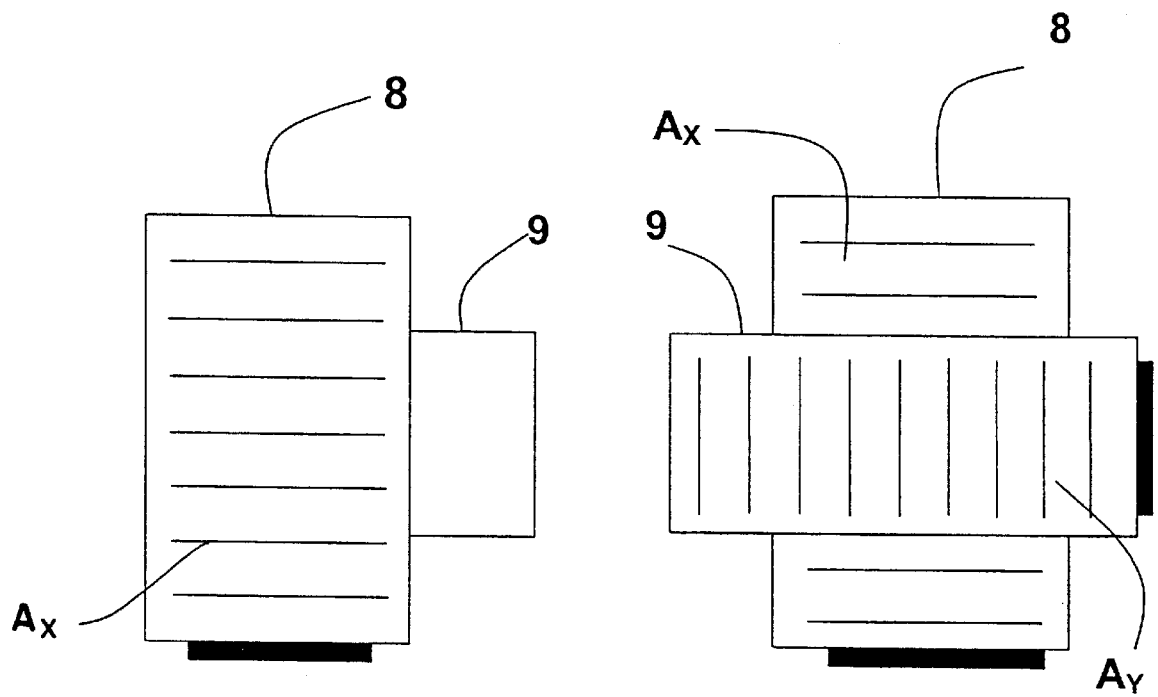
FIG. 11 is a drawing showing the orientation or positioning of the X-axis and Y-axis acousto optic deflector with respect to each other.

The positioning of the two acousto optic deflectors 8 and 9 is as shown in FIG. 11. The ultra short laser pulse 56 enters the acoustic crystal of the acousto optic deflector 8 at preferably the Bragg angle of the crystal. The acousto optic deflector 9 is positioned such that the acoustic wave $A_Y$ in the acoustic crystal of the acousto optic deflector 9 is preferably perpendicular to the acoustic wave $A_X$ in the acoustic crystal of the acousto optic deflector 8, as shown in FIG. 11. Moreover, the acoustic crystal in the acousto optic deflector 9 is positioned such that the deflected or scanning first order beam 56A from the acousto optic deflector 8 preferably enters the acoustic crystal in the acousto optic deflector 9 at its Bragg angle. The zero order beam of the acousto optic deflectors 8 and 9 may preferably be blocked.

Figure 12:
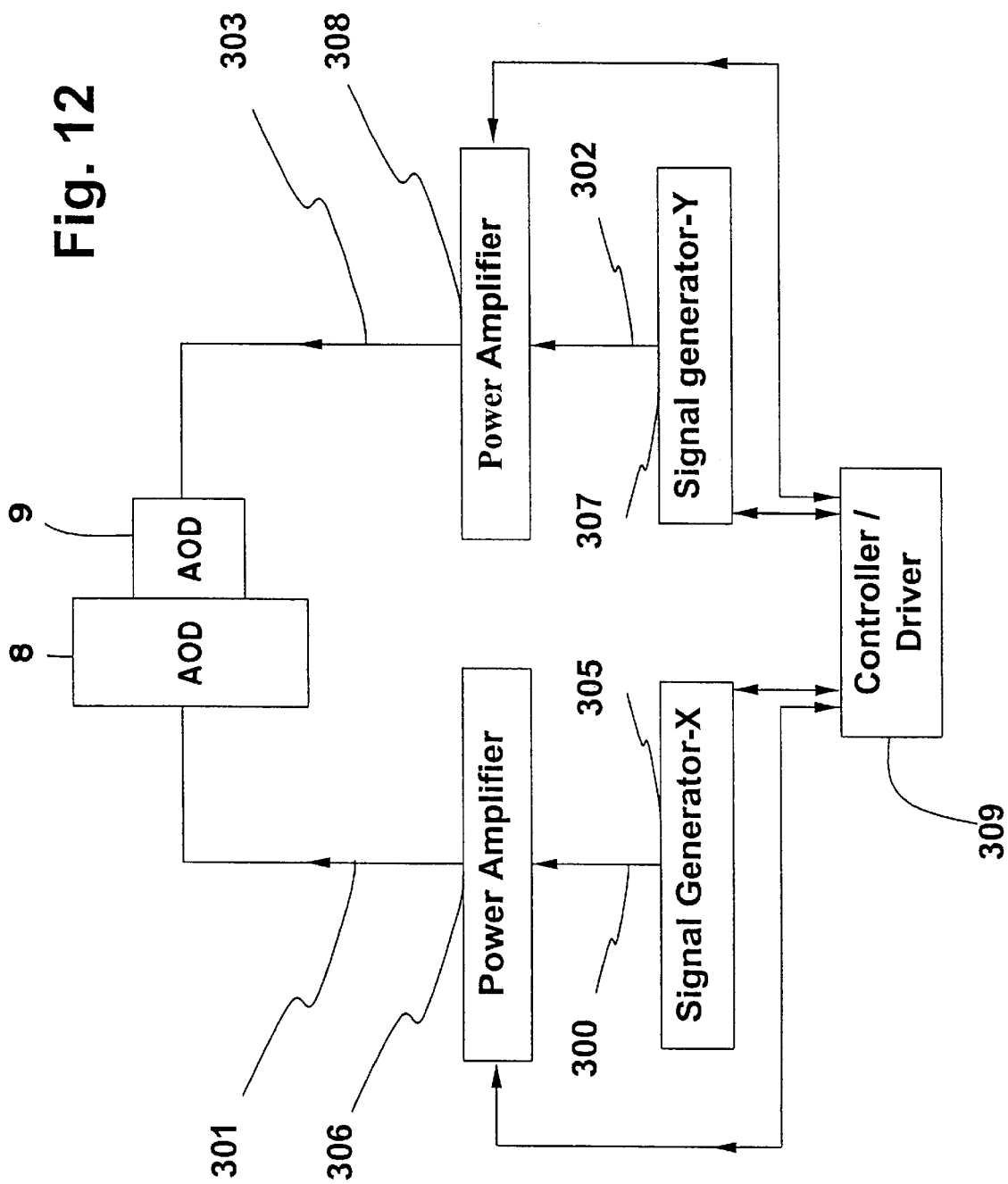
FIG. 12 is a drawing showing the control mechanism of the X-axis and Y-axi s acousto optic deflector for scanning operation of the ultra short laser pulse.

The control mechanism of the acousto optic deflector for scanning the beam in the X-axis and Y-axis is shown in FIG. 12. The sinusoidal frequency signal 300 preferably from the signal generator 305 is amplified in power by a power amplifier 306. The amplified signal 301 from the amplifier 306 is sent to the acousto optic deflector 8. Similarly, a sinusoidal frequency signal 302 from the signal generator 307 is amplified in power by preferably a power amplifier 308. The amplified signal 303 from the amplifier 308 is sent to the acousto optic deflector 9. A controller or driver 309 controls the signal generators 305 and 307 by which the position or scanning of the ultra short laser pulse may preferably be controlled. The controller or driver 309 also preferably may control the amplifiers 306 and 308 by which the intensity of the scanning ultra short laser pulse 57 may be varied.

Figure 13:
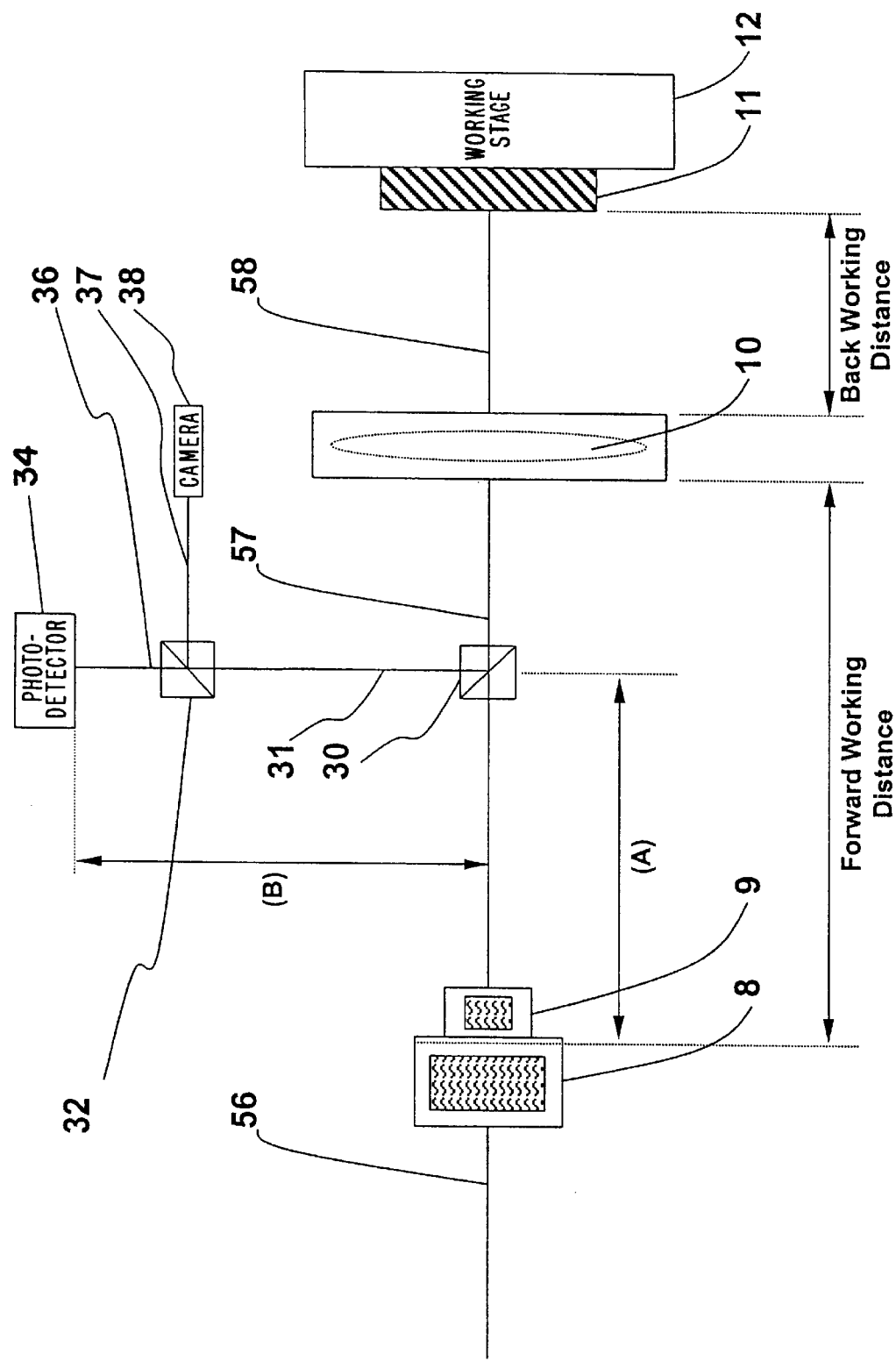
FIG. 13 is a drawing showing the positioning and alignment of the scanning lens with respect to the work piece and the acousto optic deflectors.

Referring to the FIG. 13, the scanning lens 10 is preferably a telecentric lens, F-theta lens, or confocal microscopy lens. The lens 10 is positioned such that the front working distance of the lens 10 is preferably the distance from the lens housing of the lens and the in-between exit face of the acousto optic crystal in acousto optic deflector 8 and the exit face of the acoustic crystal in the acousto optic deflector 9, where the lens 10 has its best performance (as shown in FIG. 13). The backward working distance can also be adjusted to be any where between the two acousto optic deflectors 8 and 9. The scanning lens 10 is also preferably positioned at a distance from the work surface called the back working distance of the scanning lens 10 so that the ultra short laser pulse is focused on the work surface. The back working distance of the scanning lens 10 is preferably the distance from the work surface to the output side of the lens housing of lens 10. Referring to FIG. 13, the multi quadrant photo detector 34 is placed at a distance "B" from the beam splitter 30. Also, the distance "B" is equal to the distance "A" between the beam splitter 30 and the acousto optic deflectors 8 and 9, as shown in FIG. 13. With this design the partially reflected scanned beam from the work surface comes preferably to focus at one point in the photo detector 34 as shown in FIG. 13.

Figure 14:
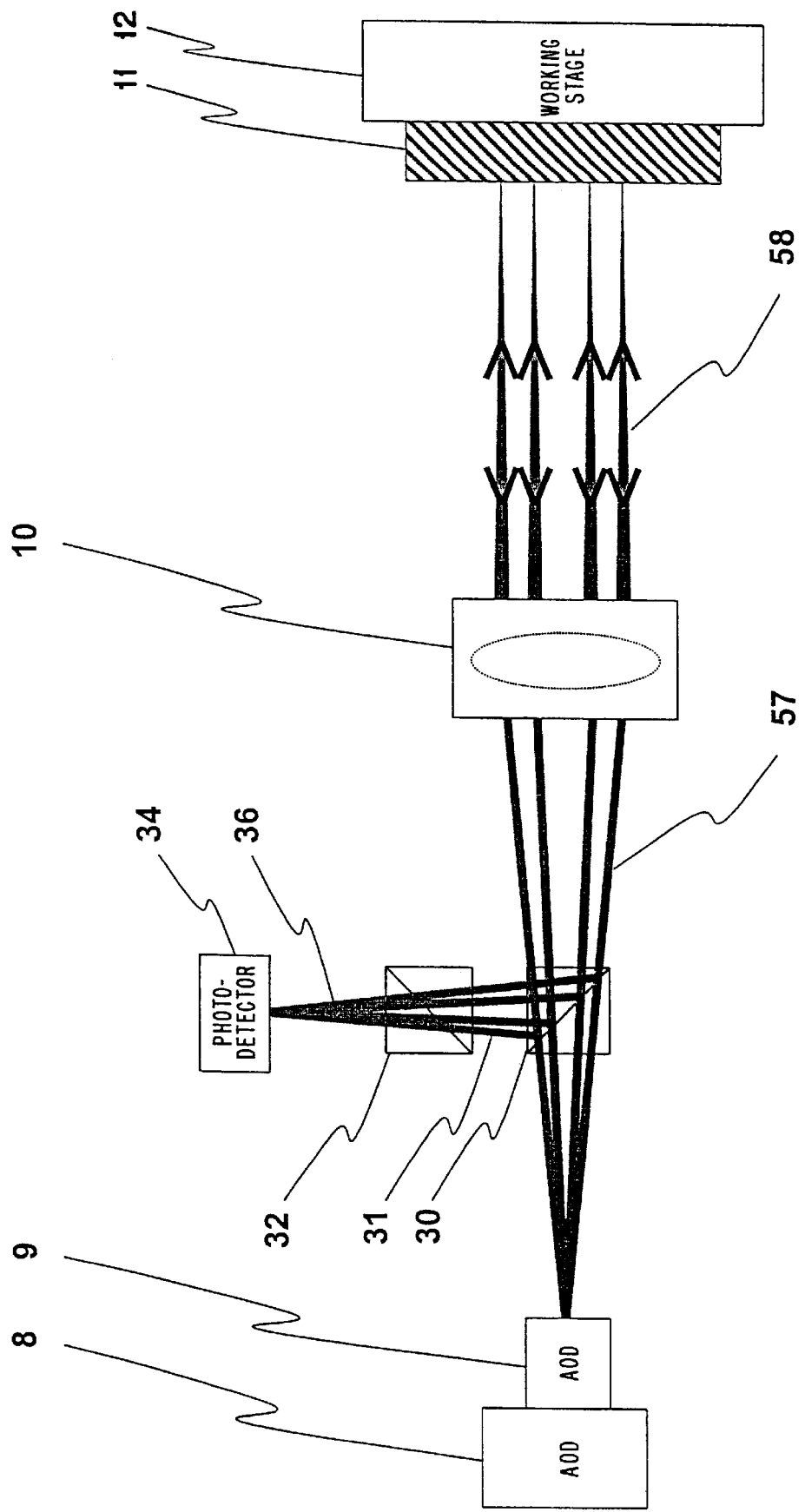
FIG. 14 is a drawing showing the working principle of the scanning lens.

The working principle of the scanning lens is as shown in FIG. 14. In order to reduce the spot size at the focal point of the scanning lens 10, the diameter of the input beam 57 is preferably made larger. In other words, the larger the diameter of the input beam 57 to the scanning lens 10 causes the focused spot size to be smaller. The beam filtering mechanism disclosed above may allow a smaller spot size (obtained by the scanning lens 10) by improving the quality of the beam.

Figure 15:
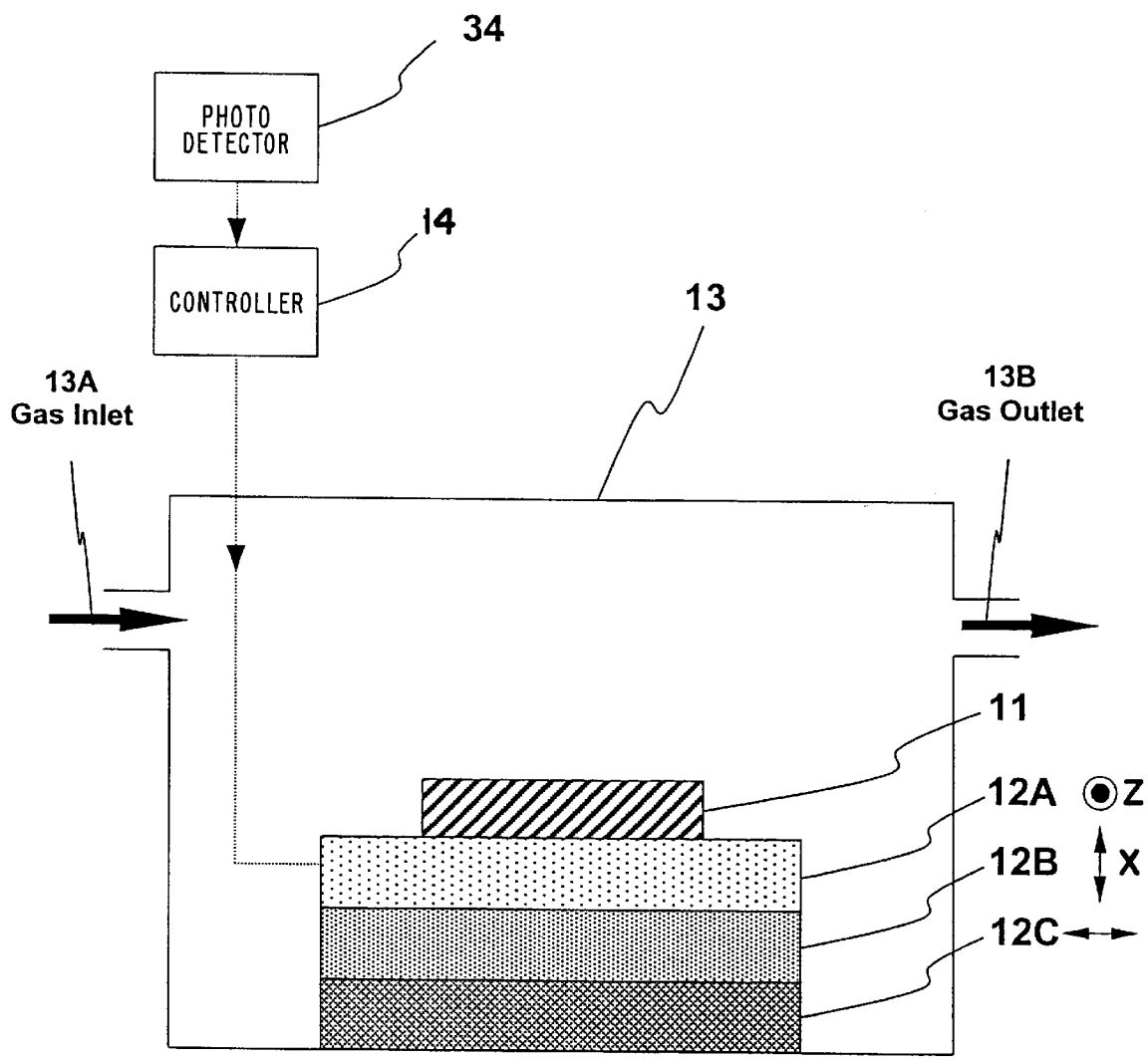
FIG. 15 is a drawing showing the work piece table with X-axis, Y-axis and Z-axis movement stage enclosed in a gas chamber.

The work piece stage is designed as shown in FIG. 15. The work piece 11 is mounted on a stage 12A driven by a piezo electric transducer for fine adjustment in the Z-axis and also with a rough adjustment servomotor or a manual controller. The piezo electric transducer is controlled preferably by a controller 14, which receives an input signal from the photo detector 34 as shown in FIG. 15. With this controlling mechanism, the machining laser beam spot on the work surface is automatically focused as with any available auto focusing mechanism. The course or rough movement of the table in the X-axis and Y-axis is provided by the stages 12B and 12C. The entire stage assembly is enclosed within a chamber 13. The chamber 13 is preferably provided with a gas inlet 13A and a gas outlet 13B. Gas is sent through the gas inlet 13A to preferably enable a gas assisted laser machining process. The process of etching or deposition reaction may also be preferably performed.

Figure 16:
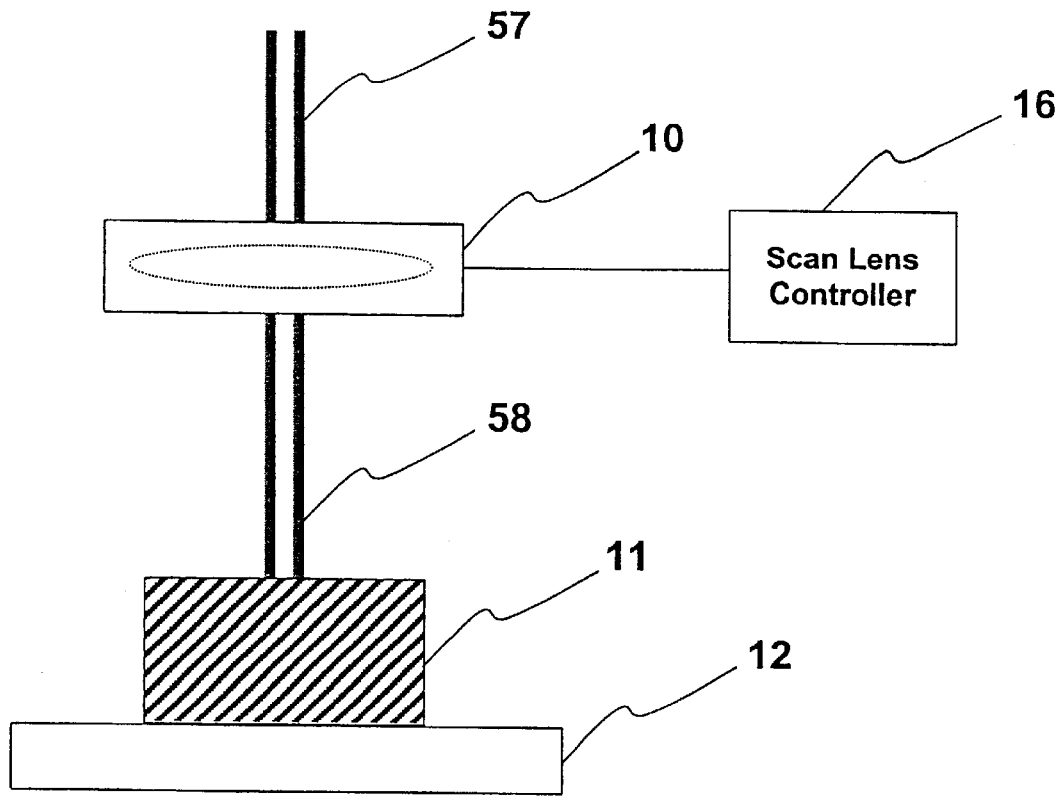
FIG. 16 is a drawing showing the control mechanism for the lateral movement of the scanning lens along the Z-axis.
Figure 17:
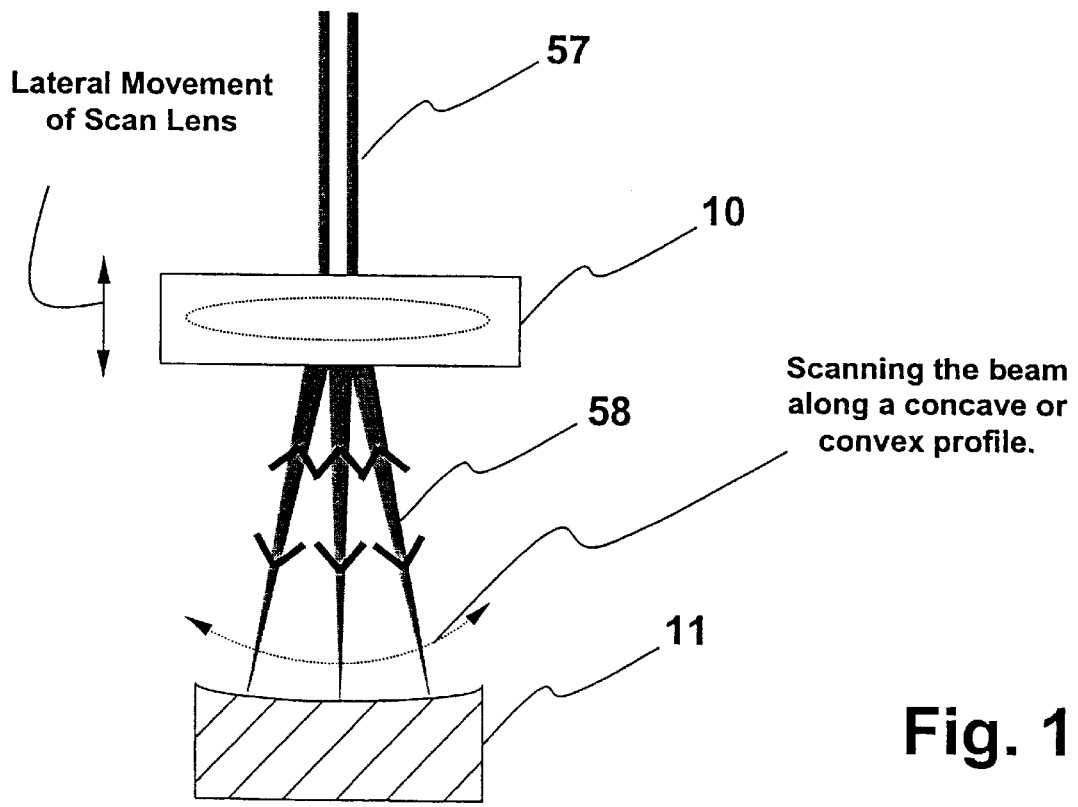
FIG. 17 is a drawing showing the mechanism for scanning the beam in a concave or convex profile by the lateral movement of the scanning lens.

In order to move the ultra short laser pulse along a concave or convex shape profile, the scanning lens 10 is moved preferably in a lateral direction as shown in FIG. 16. When the scanning lens 10 is moved in a lateral direction as shown in FIG. 16 by the scanning lens controller 16, the beam 58 can preferably scan in a concave or convex plane. Referring to FIG. 17, a concave shape may be formed in the object 11 by the lateral movement of the scanning lens 10, preferably in combination with other axis movement. Alternatively, a mechanical stage fixed to the work piece may also be employed to perform the above described operation.

Second Embodiment of the Present Invention

Figure 18:
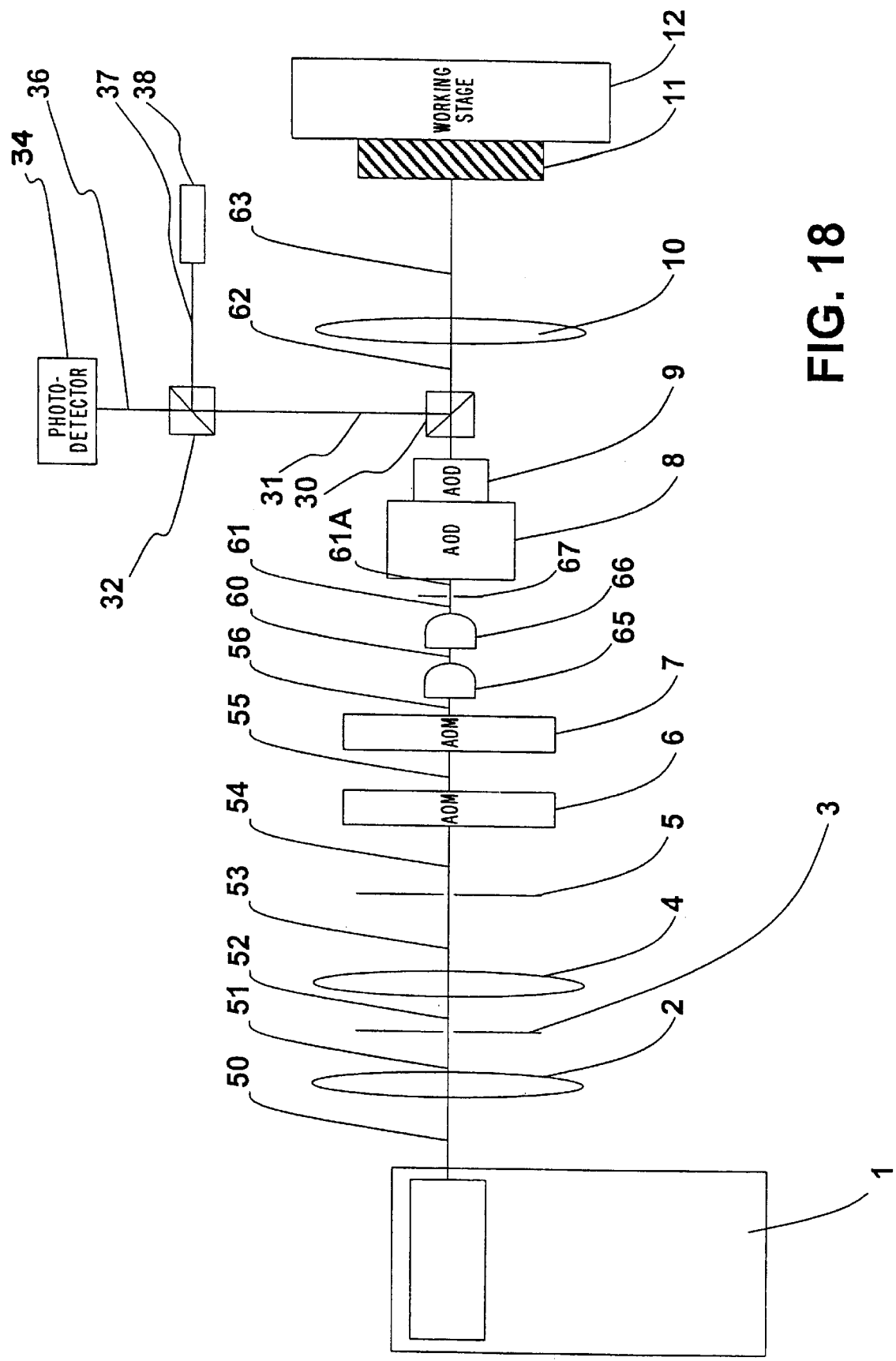
FIG. 18 is a drawing of the overall structure of the laser beam machining system according to the second embodiment of the present invention.

The second embodiment of the present invention includes the concept of using an elliptical beam for machining rather than circular beam as in an existing laser machining process. Referring to FIG. 18, the apparatus and method of the second embodiment include the same components and description as in the first preferred embodiment, and the description is denoted by the same reference numbers. The filtered and modulated ultra short laser pulse 56 passes through preferably a cylindrical lens 65. The beam 60 from the cylindrical lens 65 passes through preferably another cylindrical lens 66. As the circular profile collimated ultra short laser pulse 56 pass through cylindrical lens 65 and 66, an elliptical profile ultra short laser pulse 61 may preferably be produced. The elliptical ultra short laser pulse 61 preferably passes through a slot or diaphragm preferably designed 1–1.5 times the diameter of the beam 61 in both the axes at which its intensity is preferably $1/e^2$ of its peak intensity. The elliptical ultra short laser pulse 61A passes through the acousto optic deflectors 8 and 9, respectively. The crystal in the acousto optic deflectors 8 and 9, respectively, are preferably designed according to the dimension or shape of the ultra short laser pulse 61. The X-Y scanning ultra short laser pulse 62 from the acousto optic deflector 9 passes through the scanning lens 10, the beam 63, and it is focused on the target surface.

Figure 19:
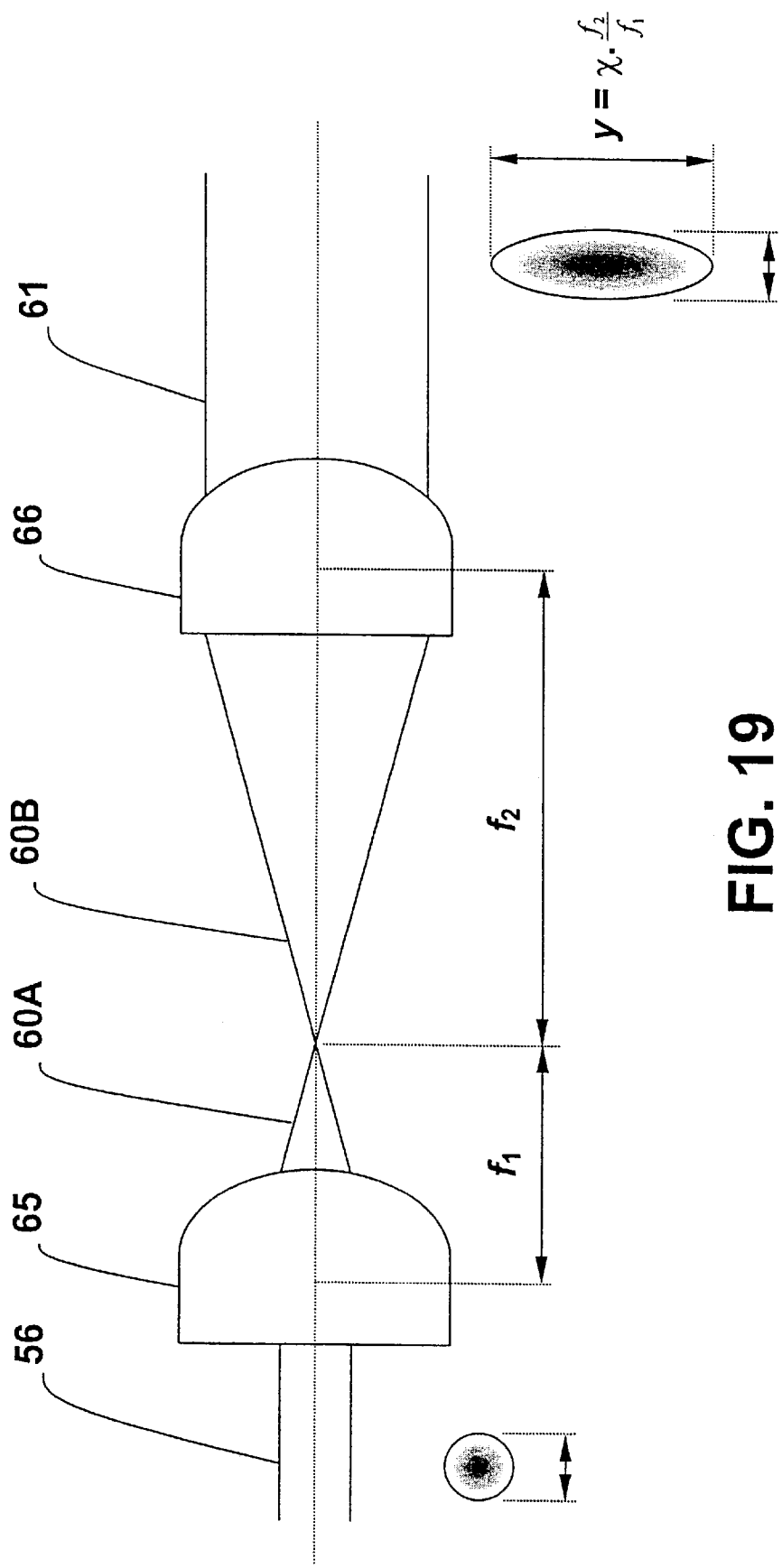
FIG. 19 is a drawing showing the alignment and orientation of the cylindrical lens to obtain an elliptical ultra short laser pulse.

Referring to FIG. 19, the collimated beam 56 has a circular profile and passes through preferably cylindrical lens 65 and 66, respectively. The lens 66 is preferably a cylindrical lens which is placed at a distance from the lens 65 that is equal to the sum of the focal distances of the lens 65 and 66. The shape of the beam 61 is elliptical, and the dimension of the beam with reference to the beam 56 is as shown in FIG. 19. The dimension of the beam 61 along X-axis preferably remains the same as the dimension of the beam 56 along the X-axis. The dimension of the beam 61 along Y-axis is magnified preferably by a factor $$\gamma = \frac{f_2}{f_1}$$

times the dimension of the beam 56 along the Y-axis.

Figure 20:
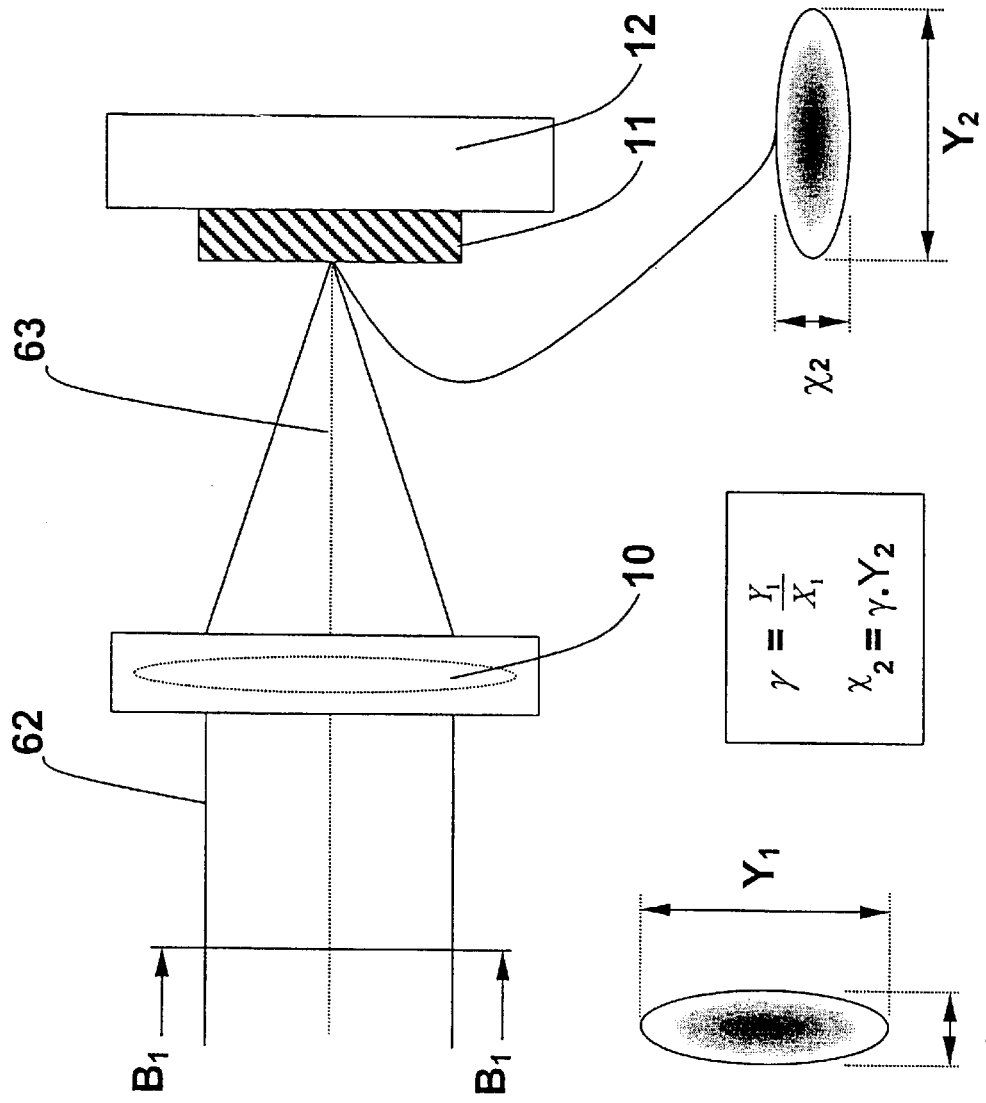
FIG. 20 is a drawing showing the working mechanism of the scanning lens when an elliptical beam passes through it rather than a circular beam.

Referring to FIG. 20, the beam 62 has an elliptical profile with $Y_1=\gamma X_1$ and passes through the scanning lens 10. The beam 63 which is focusing on to the target surface 11 has a profile where the dimension of the beam along the X-axis is given by $X_2=\gamma Y_2$ as shown in FIG. 20. This effect is due to the principle of scanning lens in which the spot size in the X-axis and the Y-axis of the beam obtained at the focal point of the scanning lens is inversely proportional to the diameter of the input beam to the scanning lens in the X-axis dan the Y-axis, respectively.

Third Embodiment of the Present Invention

Figure 21:
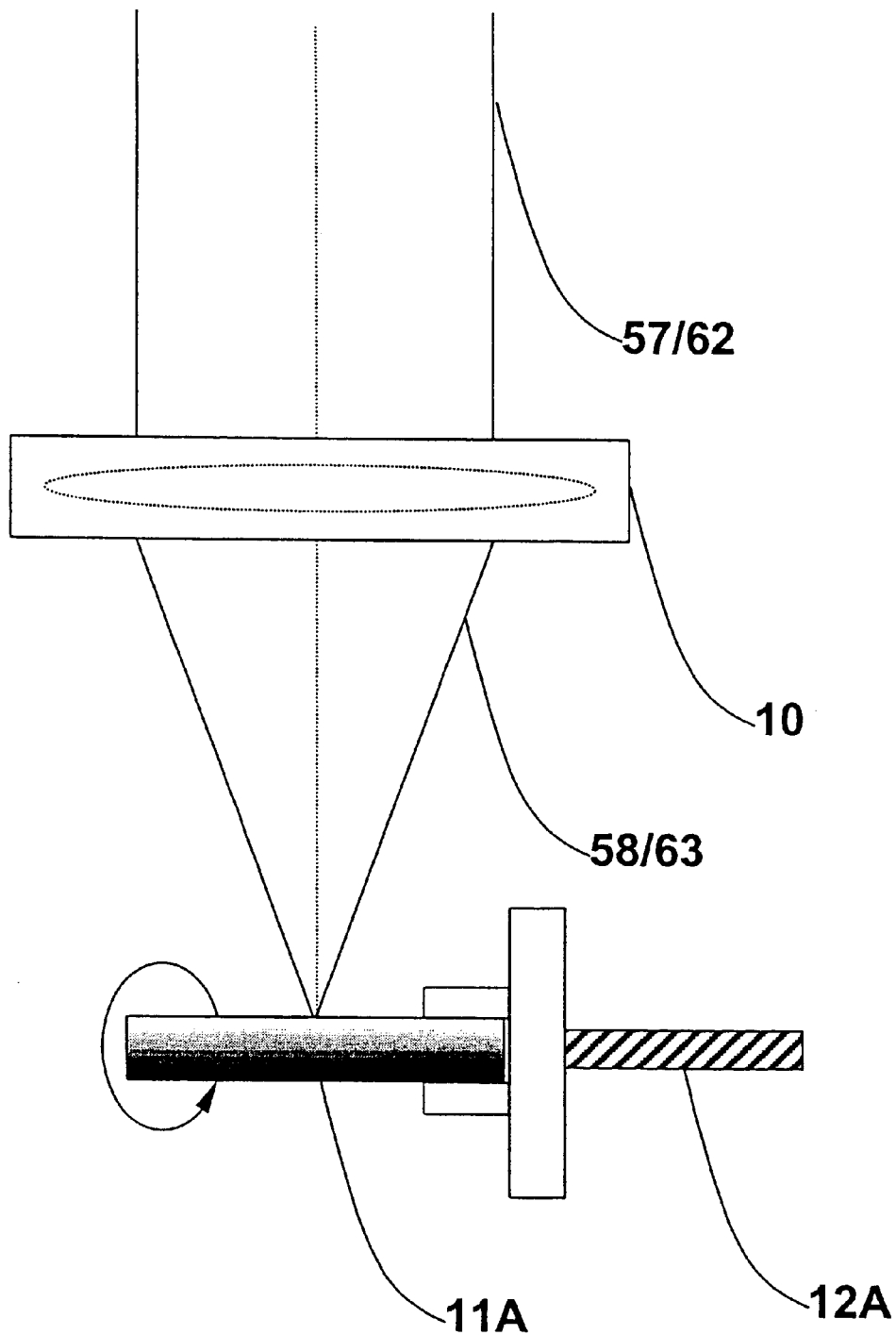
FIG. 21 is a drawing showing the machining of a rotating work piece using a circular or elliptical pulsed and modulated laser beam.

The third embodiment of present invention involves the rotation of the work piece using a precision spindle. The system performs the operation like a turning machine as shown in FIG. 21. Referring to FIG. 21, the work piece is held on a chuck of a precision rotating spindle 12A. During this operation, the pulsed and modulated beam needs to be moved along only one axis in a plane parallel to the axis of rotation of the work piece (X-axis or Y-axis) and hence the movement of the beam along the second axis (X-axis or Y-axis) is held constant. The preferred embodiment of the present invention involves circular or elliptical beams 57 or 62 as in the first and second embodiments of the present invention, respectively, as shown in FIG. 21, the beams 57 or 62 pass through the scanning lens 10. Hence the focused beams 58 or 63 results in a circular or an elliptical spot at the focal point as in the first and the second embodiments of the present invention, respectively. The speed of rotation and the ultra short laser pulse is modulated according to the requirement.

Figure 22:
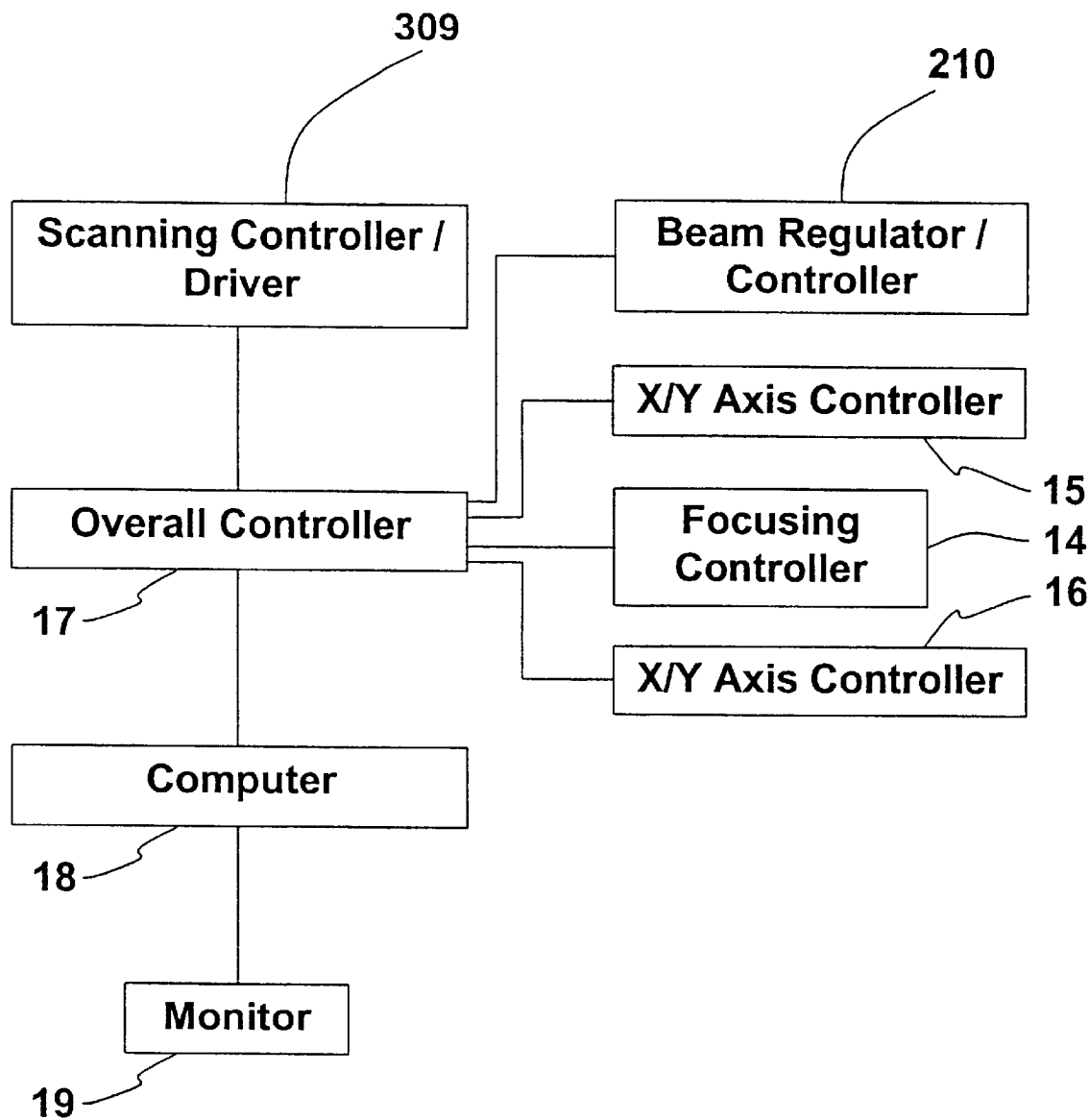
FIG. 22 is a drawing showing the overall control mechanism of the first and the second embodiments of the present invention.

The overall controller mechanism of the first, second and third preferred embodiments of the present invention is as shown in FIG. 22. The overall controller 17 preferably controls the beam regulating controller 210, scanning controller/driver 309, X-axis and Y-axis controller 15, focusing controller 14, X/Y axis controller 16. The overall controller is preferably connected to a computer 18, which is in turn is connected to the monitor 19. The system may be programmed for a specific component fabrication. The overall controller may preferably also control the intensity or energy of the ultra short laser pulse at any time period of machining.

Figure 23:
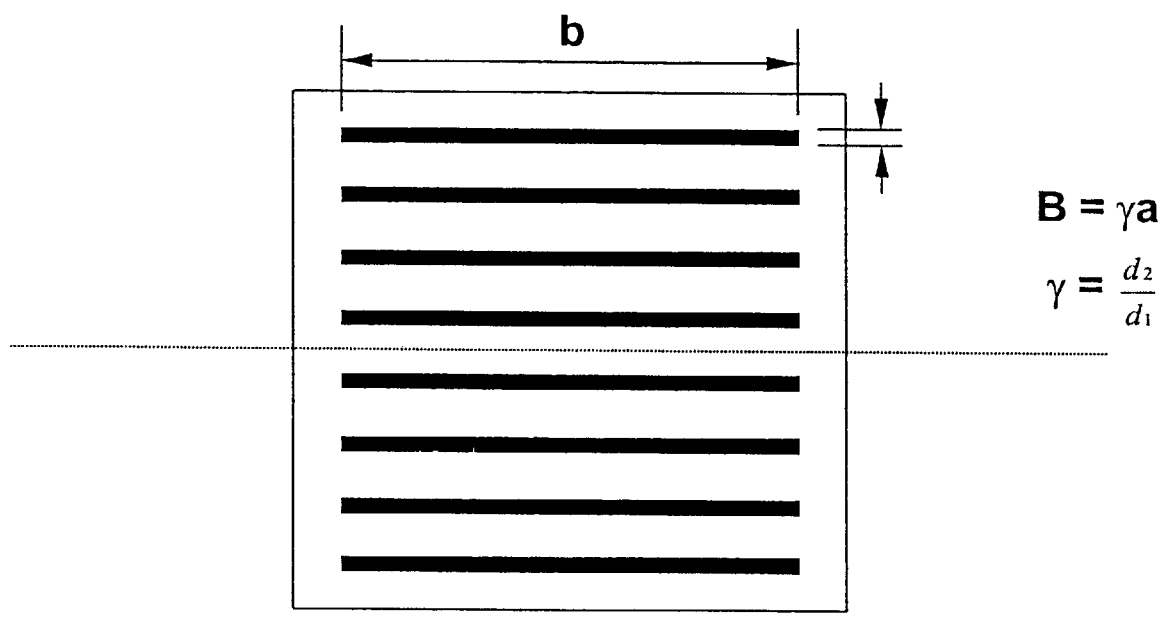
FIG. 23 is a drawing showing the application of the second embodiment of the present invention for the formation of fine grating lines.

Some of the potential applications of the disclosed invention in three dimensional micro machining include spherical and a-spherical micro lens fabrication, optical data storage, fine grating lines, etc. The grating lines can preferably be drawn using the second embodiment of the present invention by which the length and width of the grating line may be determined by the selecting the appropriate focal length of the lens 65 and 66 which determines the magnification value γ. Referring to FIG. 23, in order to obtain a grating line of width of a and length of b the focal length of the lens 65 and 66 may be selected so that $$\frac{b}{a} = \frac{f_2}{f_1}.$$

The grating line may be uniform along the entire length b, since the ultra short laser pulse 63 strikes the entire length of b rather than moving from one point to the next along the length b.

Figure 24:
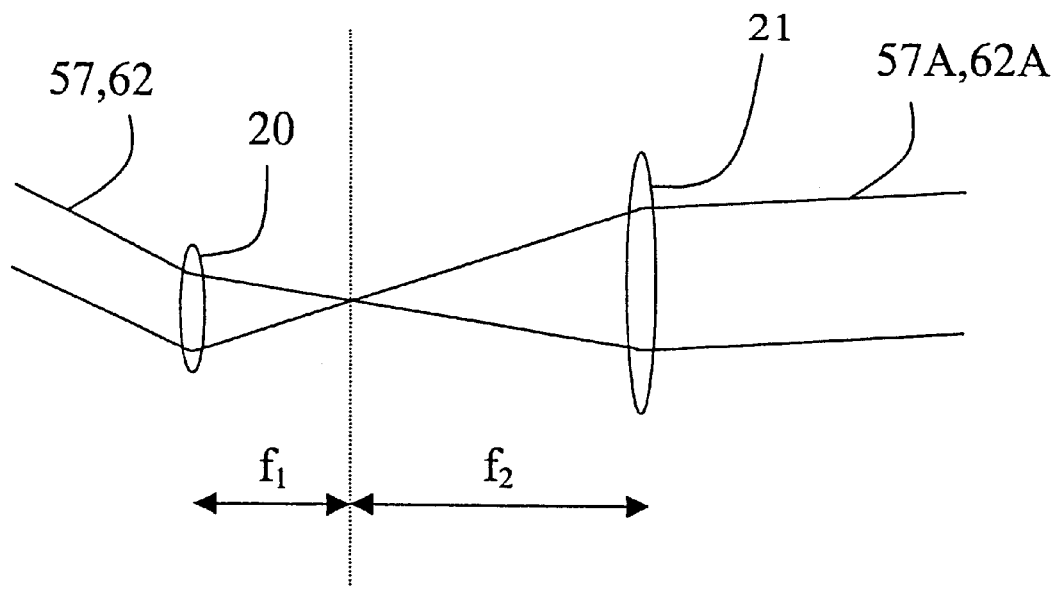
FIG. 24 is a drawing showing a combination of lenses.
Figure 25:
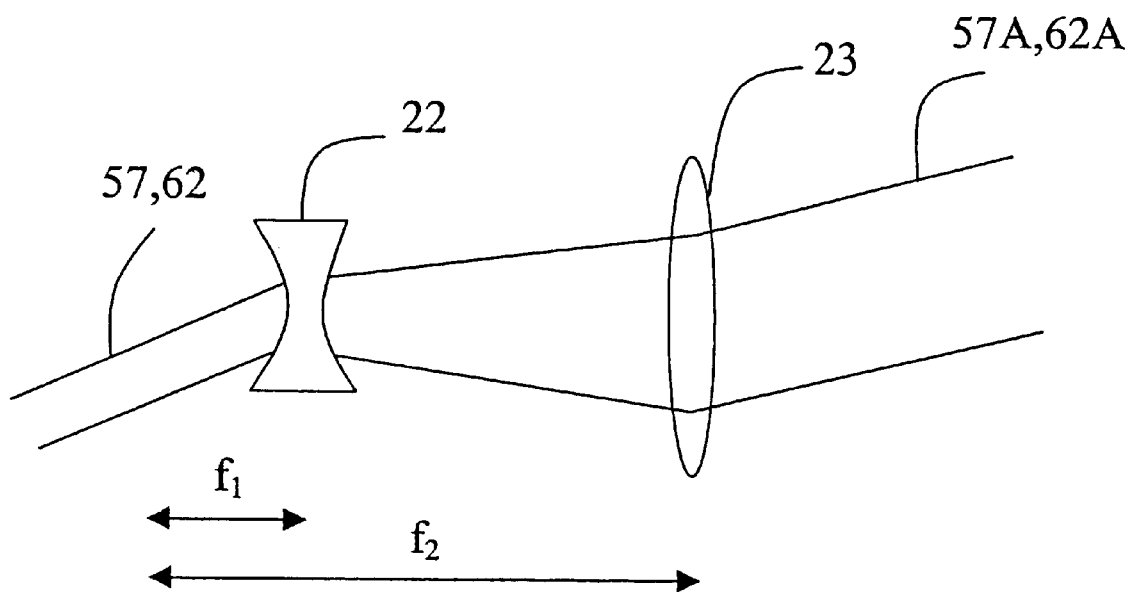
FIG. 25 is a drawing showing a combination of lenses having positive and negative focal lengths.

In order to reduce the beam diameter at the focused spot of the pulsed laser beam by the scanning lens 10, the diameter of the input beam 57 (circular laser beam profile) or 62 (elliptical laser beam profile) needs to be increased. This is accomplished by using a combination of lens as shown in FIGS. 24 and 25. This will result in increasing the beam diameter and reducing the deflection angle of the beam, thereby increasing the resolution of scanning. Referring to FIG. 24, the system comprises a combination of two lenses 20 and 21 of preferably positive focal length separated by a distance equal to the sum of the focal lengths of the two lenses. The beam 57 or 62 passes through the lens 20 and 21 which eventually results in the output beam 57A or 62A preferably of larger beam diameter and also preferably of smaller deflection angle. The output beam 57A or 62A is then made to pass through the scanning lens 10. The system acts as a Keplerian telescope. For example, if the focal length $f_1$ of lens 20 is half the focal length $f_2$ of the lens 21 then the beam diameter of the out put beam 57A or 62A will be enlarged by twice that of the beam diameter 57 or 62. Also the deflection angle is correspondingly reduced and hence the resolution of scanning is doubled. Another way to establish the same is as shown in FIG. 25. This system consists of two lenses 22 and 23 preferably of positive and negative focal length. Here the two lens 22 and 23 are separated by a distance equal to the difference in the focal length of the two lenses. The principle of expansion of the laser beam is the same as the previous system. Also the system is more compact than compared to the previous method. This system acts as a Galilean telescope. The system will lead to a more compact structure than the Keplerian telescope. This process can also be accomplished by placing a reduction lens at the focal point of the scanning lens 10.

What is claimed is:

1. A three dimensional micro machining system using an ultra short laser pulse, comprising:
    a laser source for emitting ultra short laser pulses in the range of a femto second having a variable pulsing time which may be higher or lower than a femto second;
    means for focusing the ultra short laser pulses on to the target including at least first and second lenses, a first aperture positioned between the two lenses at the focal point of the first focusing lens, and a second aperture positioned on the opposite side of the second lens; and
    means for machining the target at the focused position of the ultra short laser pulses.

2. An apparatus for three dimensional micro feature machining using an ultra short laser pulse in accordance with claim 1 wherein:
    the first and second lenses are positioned at a distance equal to the sum of the focal length of the two lenses;
    the first aperture positioned at the focal point of the first focusing lens and having a diameter 1–1.5 times the diameter of the portion of the ultra short laser pulse at which the beam intensity becomes $1/e^2$ of its peak intensity at its focal point; and
    the second lens is positioned at a distance equal to its focal length from the first aperture.

3. An apparatus for three dimensional micro feature machining using an ultra short laser pulse in accordance with claim 2 which further includes means for expanding the diameter of the ultra short laser pulse by having first and second lenses of different focal lengths, wherein the expansion ratio "α" of the ultra short laser pulse is given by $$\alpha = \frac{a}{b},$$

where "α" is the focal length of the preceding focusing or collimating lens and "b" is the focal length of the succeeding focusing or collimating lens.

4. An apparatus for three dimensional micro feature machining using an ultra short laser pulse in accordance with claim 3 which further includes means to further enhance the beam quality, wherein:
the second aperture having a diameter of 1–1.5 times the diameter of the ultra short laser pulse at which its intensity is $1/e^2$ of its peak intensity.

5. An apparatus for three-dimensional micro feature machining using an ultra short laser pulse in accordance with claim 4 which further includes means for modulating the ultra short laser pulse so that a controlled number of laser pulses strikes the target during a required period including:
at least two acousto optic modulators positioned such that the ultra short laser pulse enters the first modulator in sequence from the laser source at the Bragg's angle to its crystal;
the succeeding acousto optic modulator is positioned such that the first order beam from the preceding acousto optic modulator is incident on the crystal of the succeeding acousto optic modulator at Bragg's angle, the acousto optic modulators being positioned such that the acoustic waves in the succeeding and the preceding acousto optic modulator travel in the opposite direction; said acousto optic modulators being controlled by a controller to control the time period during which the ultra short laser pulse can pass through the acousto optic modulator; and
a delay circuit for delaying the pulsing cycle of the succeeding acousto optic modulators in comparison to the preceding acousto optic modulator to reduce the pulsing time and hence to further control the number of pulses striking the target during the required time period for machining.

6. An apparatus for three dimensional micro feature machining using an ultra short laser pulse in accordance with claim 5 which further includes means for reducing or increasing the modulation capacity by reducing or increasing the number of acousto optic modulators.

7. An apparatus for three dimensional micro feature machining using an ultra short laser pulse in accordance with claim 6 which further includes means for controlling the modulators in order to control the modulation of the ultra short laser pulse beam.

8. An apparatus for producing three dimensional micro feature machining using an ultra short laser pulse in accordance with claim 7 which further includes means for scanning the beam in the X-axis and Y-axis comprising:
one acousto optic deflector for X-axis scanning and a second acousto optic deflector for Y-axis scanning;
the acousto optic deflectors mounted such that acoustic waves in the acousto optic deflectors are perpendicular to each other;
the orientation of the acousto optic deflectors is such that the deflected beam from the preceding acousto optic deflector strikes the acoustic wave in the succeeding acoustic crystal at Bragg's angle; and
a control system for both X-axis and Y-axis scanning, which controls the frequency input to the acousto optic deflectors, and for controlling the intensity of the pulsed scanning laser beam.

9. An apparatus for producing three dimensional micro feature machining using an ultra short laser pulse in accordance with claim 8 which further includes means for focusing the ultra short laser pulse on to the target, including:
a scanning lens of either the F-theta, telecentric or confocal microscopy type to focus the scanning ultra short laser pulse;
means for positioning the scanning lens such that the distance between the target point to the output side of the scanning lens housing is equal to the back working distance of the scanning lens; and
means for positioning the scanning lens at a distance from the acousto optic deflector such that the distance between the input side of the scanning lens housing and the in between faces of the two acousto optic deflectors is equal to the forward working distance of the scanning lens.

10. An apparatus of producing three dimensional micro feature machining using an ultra short laser pulse in accordance with claim 9 which further includes means for X-axis and Y-axis movement of the work piece for coarse and fine movement.

11. An apparatus for producing three-dimensional micro feature machining using an ultra short laser pulses in accordance with claim 10 which further includes means for controlling the coarse and fine movement of the work piece in the X-axis and the Y-axis.

12. An apparatus for producing three-dimensional micro feature machining using an ultra short laser pulses in accordance with claim 11 which further includes means for moving the work piece in the Z-axis.

13. An apparatus for producing three dimensional micro feature machining using an ultra short laser pulse in accordance with claim 12 which further includes means for controlling the movement of the work piece in the Z-axis.

14. An apparatus for producing three dimensional micro feature machining using an ultra short laser pulse in accordance with claim 13 which further includes means for auto-focusing the ultra short laser pulse at the required position on the work piece surface.

15. An apparatus for producing three-dimensional micro feature machining using an ultra short laser pulse in accordance with claim 14 which further includes means for monitoring the machining of the work surface while machining.

16. An apparatus for producing three dimensional micro feature machining using an ultra short laser pulse in accordance with claim 15 which further includes means for scanning the beam along a concave or convex shape to machine concave or convex shapes comprising:
means for moving the scanning lens in a lateral direction; and
means for controlling the lateral movements of the scanning lens precisely.

17. An apparatus for producing three-dimensional micro feature machining using an ultra short laser pulse in accordance with claim 16 which further includes means for performing matter deposition or removal on the work piece, including a chamber with an inlet and an outlet for the assisting gas or vacuum chamber.

18. An apparatus for producing three dimensional micro feature machining using an ultra short laser pulse in accordance with claim 17 which further includes means for changing the shape of the ultra short laser pulse to an elliptical shape from a circular shape comprising:
  at least two cylindrical lenses placed at a distance between them equal to the sum of the focal length of the two cylindrical lens;
  wherein the focal length and the orientation of the two cylindrical lenses is designed depending on the shape of the elliptical beam required, such that the magnification factor of the ultra short laser pulse shape in Y-axis compared to the X-axis is given by $$\gamma = \frac{f_2}{f_1}$$

Where $f_1$ is the focal length of the preceding cylindrical lens and $f_2$ is the focal length of the succeeding cylindrical lens; the focused beam on the target has a profile where the dimension of beam along the X-axis is magnified by a factor $\gamma$ compared to the dimension along the Y-axis; and
  wherein the focal length and the orientation of the two cylindrical lenses is designed depending on the shape of the elliptical beam required, such that the magnification factor of the ultra short laser pulse shape in X-axis compared to the Y-axis is given by $$\gamma = \frac{f_2}{f_1}$$

where $f_1$ is the focal length of the preceding cylindrical lens and $f_2$ is the focal length of the succeeding cylindrical lens; the focused beam on the target has a profile where the dimension of beam along the Y-axis is magnified by a factor $\gamma$ compared to the dimension along the X-axis; and
  the magnification on the X-axis or the Y-axis or both the X-axis and the Y-axis is varied depending on the orientation and the focal length of the combination of cylindrical lenses or lenses of same performance as the cylindrical lens.

19. An apparatus for producing three dimensional micro feature machining using an ultra short laser pulse in accordance to claim 18 which further includes means for rotating the work piece using a precision spindle comprising:
  means for scanning the beam in a plane parallel to the axis of rotation of the work piece; and
  means for applying a circular or elliptical beam for machining.

20. An apparatus for producing three dimensional micro feature machining using an ultra short laser pulse in accordance to claim 18 which includes an elliptical ultra short laser pulse profile.

21. An apparatus for producing three-dimensional micro feature machining using an ultra short laser pulse in accordance with claim 18 which further includes means for generating grating lines of uniform quality.

22. An apparatus for producing three dimensional micro feature machining using an ultra short laser pulse in accordance with claim 21 which further includes means for filtering the beam after the beam modulation.

23. An apparatus for producing three dimensional micro feature machining using an ultra short laser pulse in accordance with claim 21 which further includes means for modulating the ultra short laser pulse using a single acousto optic modulator.

24. An apparatus for producing three dimensional micro feature machining using an ultra short laser pulse in accordance with claim 21 which further includes means for increasing the beam diameter of the laser beam before passing through the scanning lens with a of lens for reducing the focused spot size of the pulsed laser beam.

25. An apparatus for producing three dimensional micro feature machining using an ultra short laser pulse in accordance with claim 21 which further includes a beam spot size at the focused point and a reduction lens at the focal point of the scanning lens for increasing the scanning resolution.

26. An apparatus for producing three dimensional micro feature machining using an ultra short laser pulse in accordance with claim 21 which further includes a continuous laser source.

27. A method of producing three dimensional micro feature machining using an ultra short laser pulse in accordance to claim 26 has a means for mastering in optical data storage and for three dimensional optical data storage.

* * * * *